United States Patent
Tanabe et al.

(10) Patent No.: US 10,886,579 B2
(45) Date of Patent: Jan. 5, 2021

(54) MONITORING APPARATUS FOR BATTERY CELLS

(71) Applicant: DENSO CORPORATION, Kariya (JP)

(72) Inventors: Yasuhito Tanabe, Kariya (JP); Syunichi Kubo, Kariya (JP)

(73) Assignee: DENSO CORPORATION, Kariya (JP)

( * ) Notice: Subject to any disclaimer, the term of this patent is extended or adjusted under 35 U.S.C. 154(b) by 58 days.

(21) Appl. No.: 16/221,899

(22) Filed: Dec. 17, 2018

(65) Prior Publication Data
US 2019/0198944 A1 Jun. 27, 2019

(30) Foreign Application Priority Data

Dec. 25, 2017 (JP) ................................ 2017-247990

(51) Int. Cl.
*H01M 10/48* (2006.01)
*G01R 31/382* (2019.01)
*H01M 2/34* (2006.01)
*G01R 31/3835* (2019.01)
*G01R 31/396* (2019.01)

(52) U.S. Cl.
CPC ........ *H01M 10/482* (2013.01); *G01R 31/382* (2019.01); *G01R 31/3835* (2019.01); *G01R 31/396* (2019.01); *H01M 2/348* (2013.01)

(58) Field of Classification Search
CPC .............. H01M 10/482; H01M 10/425; G01R 31/3835; G01R 31/396; G01R 31/382; G01R 19/0084
See application file for complete search history.

(56) References Cited

U.S. PATENT DOCUMENTS

| | | | |
|---|---|---|---|
| 2011/0101920 A1* | 5/2011 | Seo ........................ | B60L 58/15 320/127 |
| 2012/0015222 A1* | 1/2012 | Kosugi ................... | B60L 50/51 429/93 |
| 2014/0176149 A1* | 6/2014 | Mizoguchi ........... | G01R 31/396 324/434 |
| 2018/0219204 A1 | 8/2018 | Takase et al. | |

FOREIGN PATENT DOCUMENTS

JP     2015-118731 A     6/2015

\* cited by examiner

*Primary Examiner* — Dominic E Hawkins
(74) *Attorney, Agent, or Firm* — Oliff PLC

(57) ABSTRACT

A monitoring apparatus is provided for monitoring voltages of a plurality of battery cells. The battery cells are electrically connected in series with each other and each include a pair of electrode terminals. The monitoring apparatus includes a flexible substrate, a monitoring circuit and a plurality of noise removal elements. The flexible substrate has a plurality of wiring patterns formed thereon. The wiring patterns are electrically connected with the electrode terminals of the battery cells. The monitoring circuit is electrically connected with the electrode terminals of the battery cells via the wiring patterns and configured to monitor the voltages of the battery cells inputted thereto via the wiring patterns. The noise removal elements are provided in monitoring circuit-side parts of the wiring patterns to remove noise inputted to the wiring patterns.

17 Claims, 15 Drawing Sheets

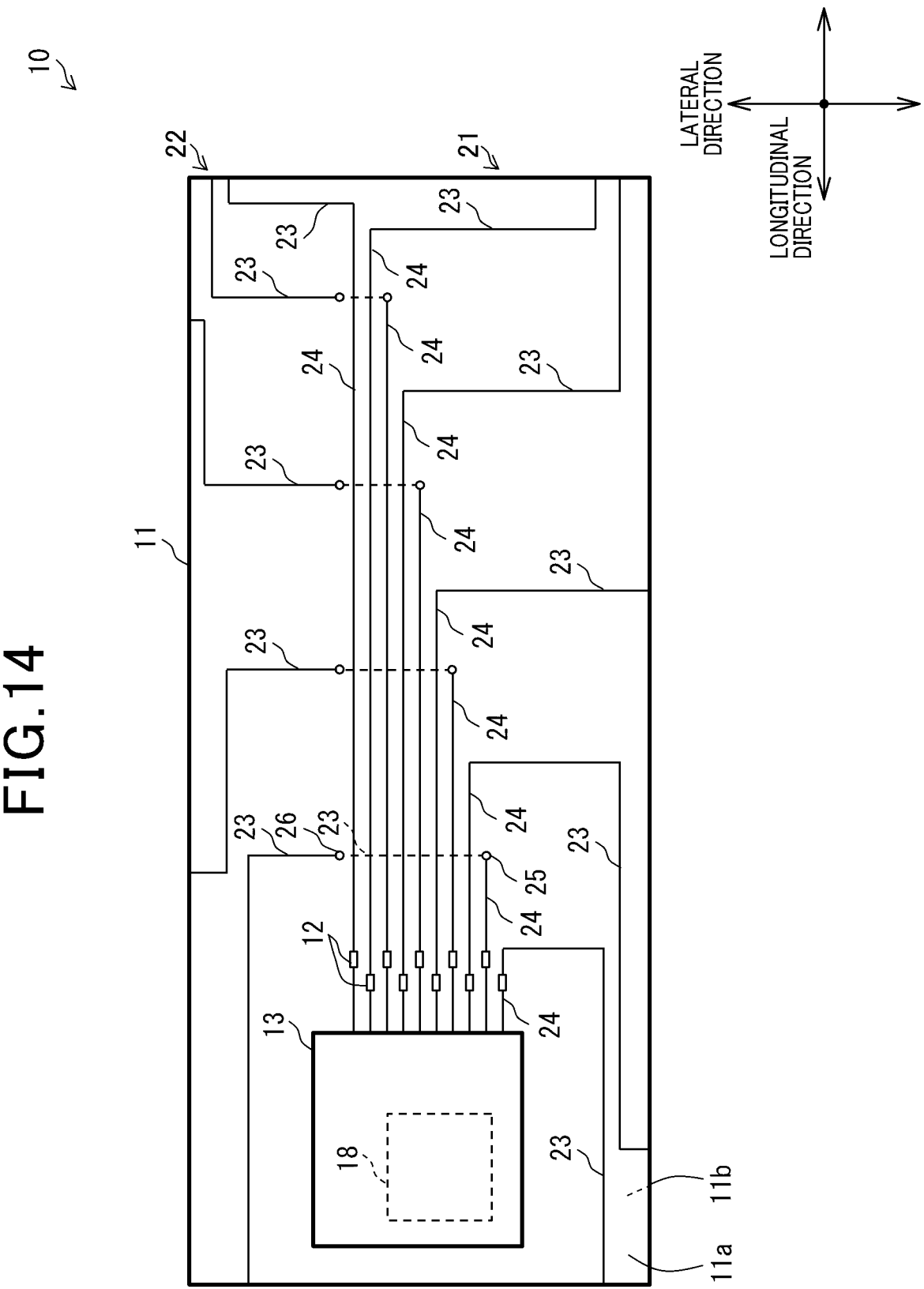

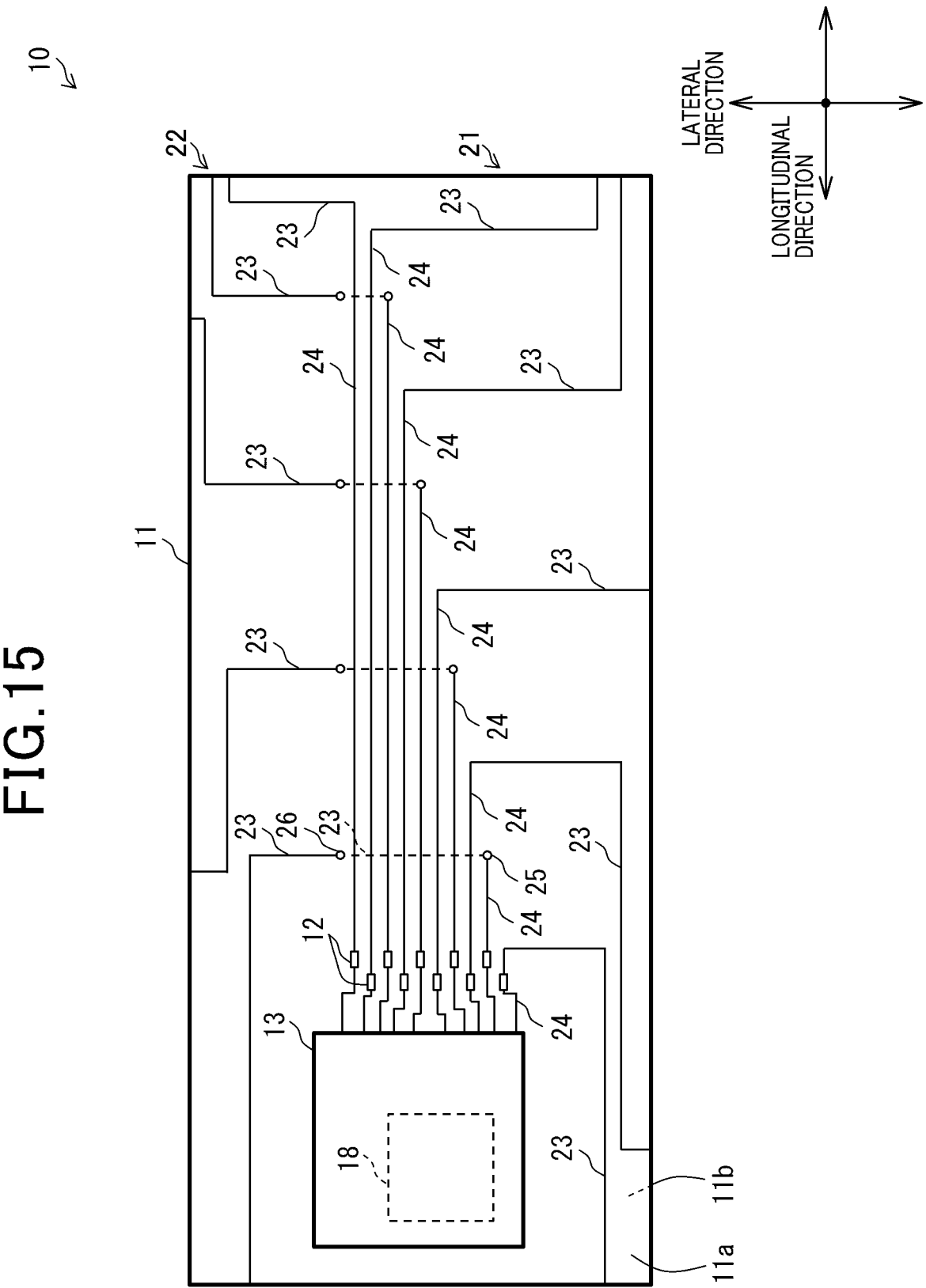

MONITORING APPARATUS FOR BATTERY CELLS

CROSS-REFERENCE TO RELATED APPLICATION

This application is based on and claims priority from Japanese Patent Application No. 2017-247990 filed on Dec. 25, 2017, the contents of which are hereby incorporated by reference in their entirety into this application.

BACKGROUND

1 Technical Field

The present disclosure relates to monitoring apparatuses for monitoring voltages of battery cells.

2 Description of Related Art

Japanese Patent Application Publication No. JP2017027831A discloses a battery wiring module that includes a plurality of connecting members (or busbars) and a flexible printed board (or FPC). Each of the connecting members connects one pair of positive and negative electrode terminals of different battery cells. The flexible printed board has a plurality of voltage detection lines formed thereon. Each of the voltage detection lines has a first end connected to one of the connecting members and a second end connected to a connector. The connector is connected to a battery ECU (Electronic Control Unit). The battery ECU performs various tasks such as detecting voltages of the battery cells and controlling charge/discharge of the battery cells.

Specifically, the battery ECU detects the voltages inputted thereto via the voltage detection lines. Therefore, when noise is inputted to the voltage detection lines, it may become impossible for the battery ECU to accurately detect the voltages.

SUMMARY

According to the present disclosure, there is provided a monitoring apparatus for monitoring voltages of a plurality of battery cells. The battery cells are electrically connected in series with each other and each include a pair of electrode terminals. The monitoring apparatus includes a flexible substrate, a monitoring circuit and a plurality of noise removal elements. The flexible substrate has a plurality of wiring patterns formed thereon. The wiring patterns are electrically connected with the electrode terminals of the battery cells. The monitoring circuit is electrically connected with the electrode terminals of the battery cells via the wiring patterns and configured to monitor the voltages of the battery cells inputted thereto via the wiring patterns. The noise removal elements are provided in monitoring circuit-side parts of the wiring patterns to remove noise inputted to the wiring patterns.

With the above configuration, compared to the case of providing the noise removal elements in electrode terminal-side parts of the wiring patterns, the lengths from the noise removal elements to the monitoring circuit-side ends of the wiring patterns are shortened. Consequently, noise is suppressed from being inputted to those parts of the wiring patterns which are respectively located between the noise removal elements and the monitoring circuit.

In addition, with the above configuration, the lengths from the noise removal elements to the electrode terminal-side ends of the wiring patterns are increased. Consequently, it becomes easier for noise to be inputted to those parts of the wiring patterns which are respectively located between the noise removal elements and the electrode terminal-side ends of the wiring patterns. However, even if noise is inputted to those parts of the wiring patterns which are respectively located between the noise removal elements and the electrode terminal-side ends of the wiring patterns, it is possible to remove the noise with the noise removal elements.

Accordingly, with the above configuration, it is possible to suppress input of noise to the monitoring circuit. As a result, it is possible to suppress the accuracy of the monitoring of the voltages of the battery cells by the monitoring circuit from being lowered due to noise.

BRIEF DESCRIPTION OF THE DRAWINGS

In the accompanying drawings:

FIG. 14 is a schematic top view illustrating the arrangement of board wirings of a monitoring unit of the monitoring apparatus according to the second embodiment; and FIG. 15 is a schematic top view illustrating the arrangement of board wirings according to an eighth modification.

DESCRIPTION OF EMBODIMENTS

Figure 1:
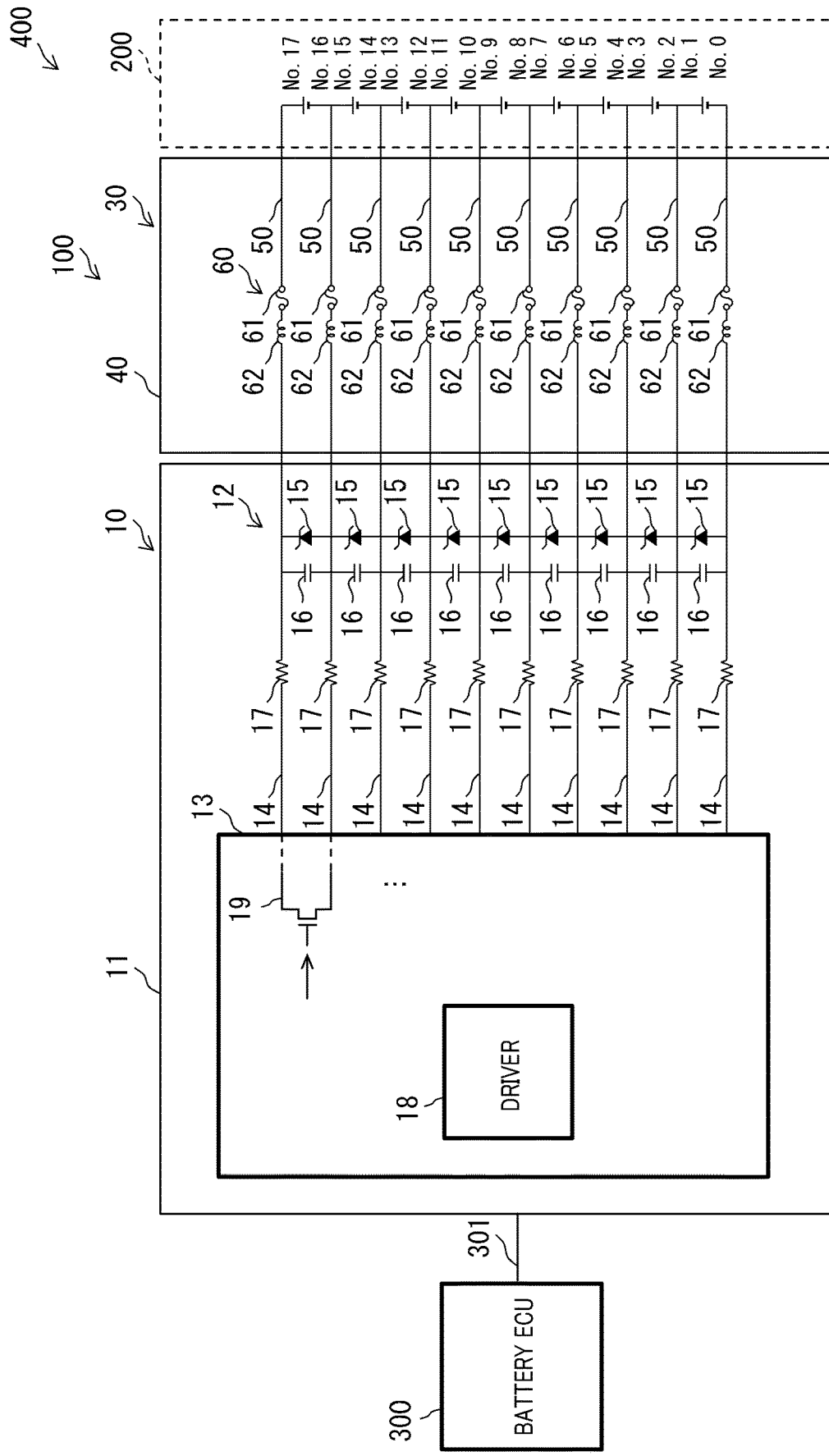
FIG. 1 is a schematic circuit diagram of a battery pack which includes a monitoring apparatus according to a first embodiment.

Exemplary embodiments and their modifications will be described hereinafter with reference to FIGS. 1-15. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

A monitoring apparatus 100 according to the first embodiment and a battery pack 400 which includes the monitoring apparatus 100 will be described hereinbelow with reference to FIGS. 1-6.

For the sake of convenience of explanation, hereinafter, three mutually perpendicular directions of the battery pack 400 will be respectively referred to as the lateral direction, the longitudinal direction and the height direction.

In the present embodiment, the battery pack 400 is designed to be used in, for example, a hybrid vehicle. In this case, the lateral direction of the battery pack 400 coincides with the longitudinal direction (or forward-backward direction) of the hybrid vehicle. The longitudinal direction of the battery pack 400 coincides with the lateral direction (or left-right direction) of the hybrid vehicle. The height direction of the battery pack 400 coincides with the height direction of the hybrid vehicle. In addition, when the hybrid vehicle is parked on a horizontal road surface, the height direction of the battery pack 400 coincides with the vertical direction; the lateral and longitudinal directions of the battery pack 400 respectively coincide with two mutually perpendicular horizontal directions.

(Overview of Battery Pack)

In the present embodiment, the battery pack 400 is designed to supply electric power to electrical loads of the hybrid vehicle. The electrical loads of the hybrid vehicle include a motor-generator that selectively functions either as an electric motor or as an electric generator. When the motor-generator functions as an electric motor, the battery pack 400 discharges to supply electric power to the motor-generator. In contrast, when the motor-generator functions as an electric generator, the battery pack 400 is charged with electric power generated by the motor-generator.

As shown in FIG. 1, the battery pack 400 includes a battery ECU (Electronic Control Unit) 300. The battery ECU 300 is electrically connected with various in-vehicle ECUs provided in the hybrid vehicle. The battery ECU 300 and the in-vehicle ECUs communicate with each other to perform, in cooperation with each other, various controls on the hybrid vehicle. These controls include, for example, control of the operation of the motor-generator either as an electric motor or as an electric generator according to the SOC (State of Charge) of the battery pack 400 and control of the output of an internal combustion engine of the hybrid vehicle.

Figure 2:
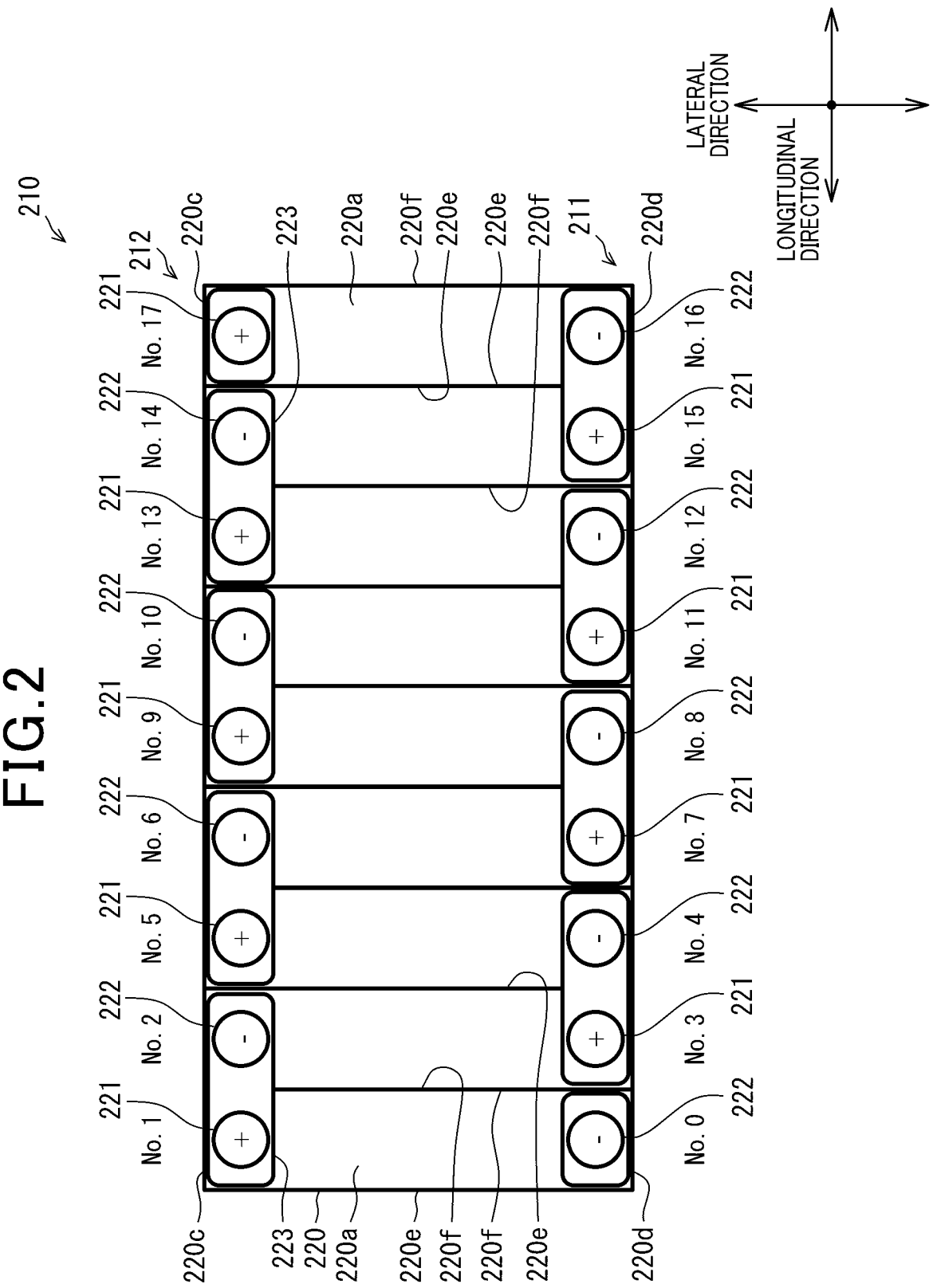
FIG. 2 is a schematic top view of a battery stack of the battery pack.

The battery pack 400 also includes a battery module 200. As shown in FIG. 2, the battery module 200 includes a battery stack 210 that is formed by both electrically and mechanically connecting a plurality of battery cells 220 in series with each other.

The battery pack 400 further includes a monitoring apparatus 100. The monitoring apparatus 100 detects the voltages of the battery cells 220 forming the battery stack 210, monitors the detected voltages and outputs the monitoring results to the battery ECU 300. Moreover, the monitoring apparatus 100 performs a process of balancing the SOCs of the battery cells 220 in accordance with a command signal from the battery ECU 300.

As described above, the battery pack 400 includes the monitoring apparatus 100, the battery module 200 and the battery ECU 300. Moreover, though not shown in the figures, the battery pack 400 also includes a cooling fan for cooling the battery module 200. In addition, the drive of the cooling fan is controlled by the battery ECU 300.

The battery pack 400 is arranged, for example, under a seat in the hybrid vehicle. More specifically, in a vehicle, the space under a rear seat is generally wider than the space under a front seat. Therefore, in the present embodiment, the battery pack 400 is arranged under a rear seat in the hybrid vehicle. As an alternative, the battery pack 400 may be arranged in the space between the rear seat and a trunk in the hybrid vehicle. As another alternative, the battery pack 400 may be arranged in the space between driver's and front-passenger seats in the hybrid vehicle.

(Overview of Battery Module)

As described previously, the battery module 200 includes the battery stack 210. Moreover, though not shown in the figures, the battery module 200 also includes a battery case that receives the battery stack 210 therein. The battery case includes a case main body and a lid. The case main body is formed by aluminum die casting. Alternatively, the case main body may be formed by press working on an iron or stainless-steel plate. On the other hand, the lid is formed of a resin or metal material.

The case main body is shaped in a box having a bottom and an opening that opens in the height direction. In the case main body, there are formed flow passages through which cooling air flows. The opening of the case main body is covered with the lid. In at least one of the case main body and the lid, there are formed communication holes through which the flow passages communicate with the external atmosphere. The battery stack 210 is received in a receiving space defined by the case main body and the lid.

The battery stack 210 is formed of the battery cells 220 that are stacked in the longitudinal direction and connected both electrically and mechanically in series with each other. Therefore, the output voltage of the battery module 200 is equal to the sum of the output voltages of the battery cells 220. In addition, the longitudinal direction corresponds to a first direction in which the battery cells 220 are arranged.

(Overview of Monitoring Apparatus)

As shown in FIG. 1, the monitoring apparatus 100 includes a monitoring unit 10 that monitors the voltages of the battery cells 220 and a wiring unit 30 that electrically connects the monitoring unit 10 with each of the battery cells 220.

The monitoring apparatus 100 is arranged adjacent to the battery module 200. Specifically, the monitoring unit 10 of the monitoring apparatus 100 is arranged in alignment with the battery stack 210 in the height direction. Alternatively, the monitoring unit 10 may be arranged in alignment with the battery stack 210 in the lateral direction. The wiring unit 30 of the monitoring apparatus 100 is arranged in alignment with the battery stack 210 in the height direction.

(Configuration of Battery Stack)

As shown in FIG. 2, the battery stack 210 is formed of the battery cells 220. Each of the battery cells 220 is shaped in a rectangular cuboid. Therefore, each of the battery cells 220 has six faces.

Specifically, as shown in FIG. 2, each of the battery cells 220 has an upper end face 220a and a lower end face 220b (not shown) that respectively face opposite sides in the height direction (i.e., the direction perpendicular to the paper surface of FIG. 2). Moreover, each of the battery cells 220 also has a first side face 220c and a second side face 220d that respectively face opposite sides in the lateral direction. Furthermore, each of the battery cells 220 also has a first major face 220e and a second major face 220f that respectively face opposite sides in the longitudinal direction.

Each of the battery cells 220 is a secondary battery. More particularly, in the present embodiment, each of the battery cells 220 is implemented by a lithium-ion battery that generates electromotive force by chemical reactions. The generated electromotive force causes electric current to flow in the battery cells 220, thereby generating heat. Moreover, the generated heat causes gas to be produced in the battery cells 220, thereby causing the battery cells 220 to swell.

It should be noted that the battery cells 220 forming the battery stack 210 may alternatively be implemented by other secondary batteries, such as nickel-metal hydride batteries or organic radical batteries.

As described previously, in each of the battery cells 220, the area of each of the first and second major faces 220e and 220f facing in the longitudinal direction is larger than the area of each of the upper and lower end faces 220a and 220b facing in the height direction as well as than the area of each of the first and second side faces 220c and 220d facing in the lateral direction. Therefore, it is easier for each of the battery cells 220 to swell in the longitudinal direction (i.e., the stacking direction of the battery cells 220) than in the height direction or in the lateral direction.

In view of the above, in the battery stack 210, there are provided restraints (not shown) on both sides of the battery cells 220 in the longitudinal direction to suppress swelling of the battery cells 220 in the longitudinal direction. In addition, between each adjacent pair of the battery cells 220, there is formed a gap through which the cooling air flows to cool the battery cells 220.

In each of the battery cells 220, on the upper end face 220a, there are formed two electrode terminals, i.e., a positive terminal 221 and a negative terminal 222. The positive and negative terminals 221 and 222 are aligned with and spaced from each other in the lateral direction. The positive terminal 221 is located on the first side face 220c side while the negative terminal 222 is located on the second side face 220d side. In addition, the upper end face 220a corresponds to a formation surface on which the positive and negative terminals 221 and 222 are formed.

As shown in FIG. 2, the battery cells 220 are arranged in the longitudinal direction so that for each adjacent pair of the battery cells 220, either the first major faces 220e of the pair of the battery cells 220 or the second major faces 220f of the pair of the battery cells 220 face each other in the longitudinal direction. Moreover, for each adjacent pair of the battery cells 220, the positive and negative terminals 221 and 222 of one of the pair of the battery cells 220 are respectively aligned with the negative and positive terminals 222 and 221 of the other of the pair of the battery cells 220 in the longitudinal direction. Consequently, in the battery stack 210, the positive terminals 221 of the battery cells 220 are arranged alternately with the negative terminals 222 of the battery cells 220 in the longitudinal direction.

More specifically, in the battery stack 210, there are formed a first electrode-terminal group 211 and a second electrode-terminal group 212 that are aligned with and spaced from each other in the lateral direction. In each of the first and second electrode-terminal groups 211 and 212, the positive terminals 221 of the battery cells 220 are arranged alternately with the negative terminals 222 of the battery cells 220 in the longitudinal direction. However, the arrangement order of the positive and negative terminals 221 and 222 in the first electrode-terminal group 211 is opposite to the arrangement order of the positive and negative terminals 221 and 222 in the second electrode-terminal group 212.

Moreover, in each of the first and second electrode-terminal groups 211 and 212, adjacent pairs of the positive and negative terminals 221 and 222 are electrically connected via respective connecting members 223 that extend in the longitudinal direction. Consequently, all of the battery cells 220 forming the battery stack 210 are electrically connected in series with each other.

More particularly, in the present embodiment, the battery stack 210 is formed of nine battery cells 220 that are electrically connected in series with each other. Accordingly, the total number of the positive and negative terminals 221 and 222 in the battery stack 210 is equal to 18. As shown in FIGS. 1 and 2, to the 18 electrode terminals, there are assigned reference numbers (No.) which increase with increase in the electric potentials of the electrode terminals from a lowest electric potential to a highest electric potential.

That is, of the 18 electrode terminals, the negative terminal 222 which is denoted by "No. 0" has the lowest electric potential (i.e., is grounded) while the positive terminal 221 which is denoted by "No. 17" has the highest electric potential that is equal to the sum of the output voltages of all the battery cells 220. The negative terminal 222 having the lowest electric potential and the positive terminal 221 having the highest electric potential are connected to the electrical loads. Consequently, the difference between the lowest electric potential and the highest electric potential is outputted as the output voltage of the battery module 200 to the electrical loads.

(Circuit Configuration of Monitoring Apparatus)

As shown in FIG. 1, the monitoring unit 10 of the monitoring apparatus 100 includes a printed board 11, first electronic elements 12 and a monitoring IC (Integrated Circuit) chip 13. The first electronic elements 12 and the monitoring IC chip 13 are mounted on the printed board 11 and electrically connected with each other via wirings 14 of the printed board 11. Hereinafter, the wirings 14 of the printed board 11 will be simply be referred to as the board wirings 14. In addition, the printed board 11 corresponds to a wiring board.

To the printed board 11 of the monitoring unit 10, there is connected the wiring unit 30. Consequently, the battery stack 210 and the monitoring unit 10 are electrically connected via the wiring unit 30. Moreover, on the printed board 11 of the monitoring unit 10, there is provided a connector (not shown) to which electric wires 301 as shown in FIG. 1 are connected. Consequently, the monitoring unit 10 and the battery ECU 300 are electrically connected via the electric wires 301.

Figure 3:
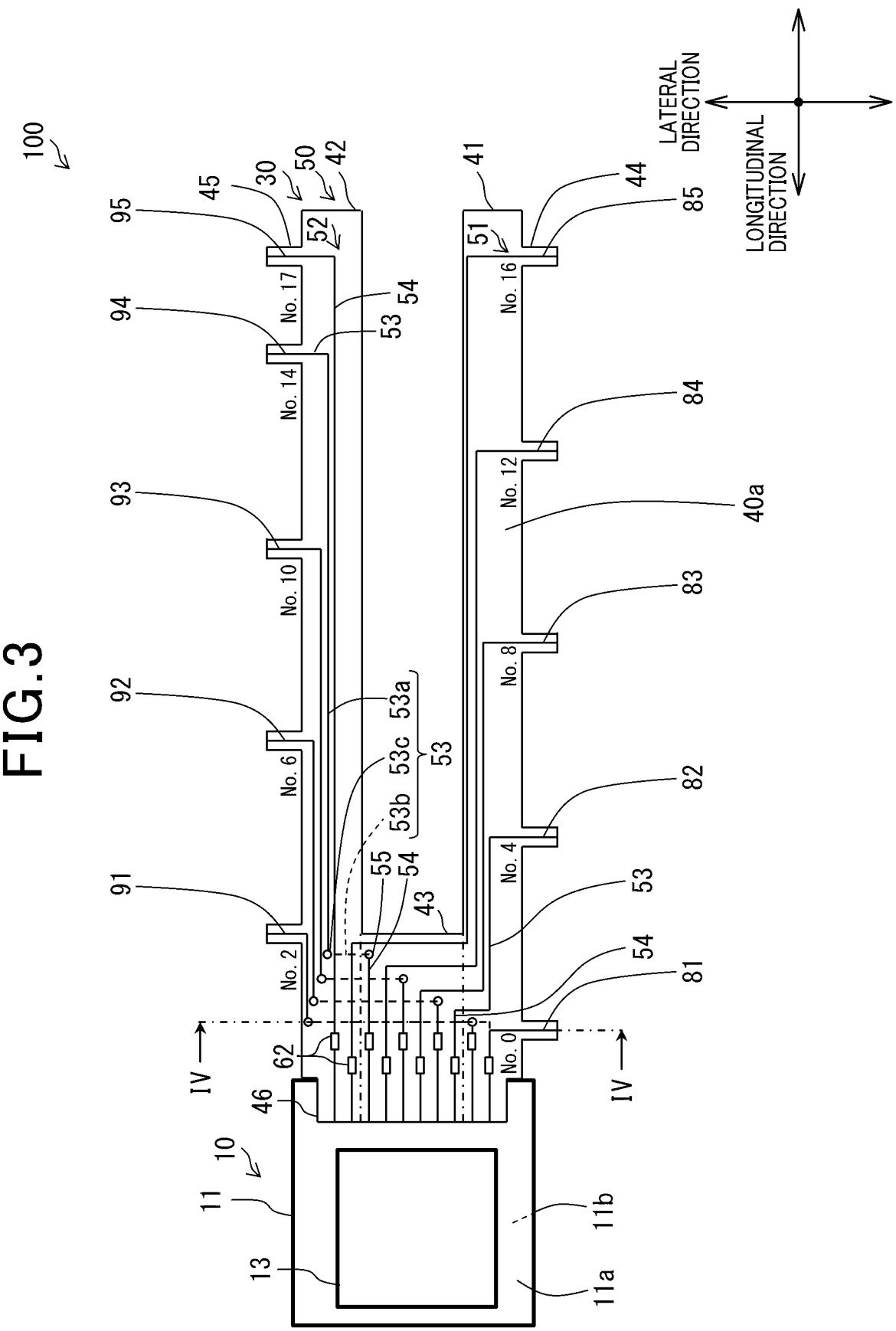
FIG. 3 is a schematic top view of the monitoring apparatus according to the first embodiment.

As shown in FIG. 3, the wiring unit 30 includes a flexible substrate 40 that has flexibility. Moreover, the wiring unit 30 has a plurality of wiring patterns 50 formed on a front surface 40a of the flexible substrate 40, on a back surface 40b of the flexible substrate 40 and inside the flexible substrate 40.

Referring back to FIG. 1, the wiring patterns 50 are respectively connected to intermediate points between the battery cells 220 that are electrically connected in series with each other, that positive terminal 221 which has the highest electric potential among all of the positive and negative terminals 221 and 222 of the battery cells 200 and that negative terminal 222 which has the lowest electric potential among all of the positive and negative terminals 221 and 222 of the battery cells 200. The wirings 14, which are formed on the printed board 11 as described above, respectively correspond to the wiring patterns 50. Each corresponding pair of the wiring patterns 50 and the board wirings 14 are electrically connected with each other.

For the sake of convenience of explanation, hereinafter, each electrically-connected pair of the wiring patterns 50 and the board wirings 14 will be together referred to as a voltage detection line.

As shown in FIG. 1, on the flexible substrate 40 of the wiring unit 30, there are mounted second electronic elements 60. The second electronic elements 60 include fuses 61 and inductors 62. On the other hand, the first electronic elements 12, which are mounted on the printed board 11 of the monitoring unit 10, include Zener diodes 15, capacitors 16 and resistors 17.

Moreover, as shown in FIG. 1, on each of the voltage detection lines, there are provided one of the fuses 61, one of the inductors 62 and one of the resistors 17. Specifically, the one of the fuses 61, the one of the inductors 62 and the one of the resistors 17 are arranged in this order from the battery module 200 side to the monitoring IC chip 13 side and electrically connected in series with each other.

On the other hand, between each adjacent pair of the voltage detection lines that are arranged in order of electric potential, there are connected one of the Zener diodes 15 and one of the capacitors 16 in parallel with each other. More specifically, the one of the Zener diodes 15 and the one of the capacitors 16 are connected between the inductor 62 and the resistor 17 in each of the adjacent pair of the voltage detection lines. Moreover, the one of the Zener diodes 15 has its anode electrode connected to that one of the adjacent pair of the voltage detection lines whose electric potential is lower and its cathode electrode connected to that one of the adjacent pair of the voltage detection lines whose electric potential is higher.

With the above configuration, each corresponding pair of one of the resistors 17 and one of the capacitors 16 together form an RC circuit. The inductors 62 and the RC circuits formed of the resistors 17 and the capacitors 16 serve to remove noise during detection of the voltages of the battery cells 220. In the present embodiment, the inductors 62 correspond to noise removal elements; the RC circuits formed of the resistors 17 and the capacitors 16 correspond to noise removal filters.

The Zenner diodes 15 are configured to be short-circuited when an overvoltage is applied thereto by the battery module 200. Specifically, each of the Zener diodes 15 has a structure in which a PN junction-type IC chip is sandwiched directly between a pair of leads. That is, each of the Zener diodes 15 does not have a structure in which an IC chip is connected with leads via wires. Consequently, the Zener diodes 15 are prevented from being open-circuited due to breakdown of wires when an overvoltage is applied to the Zener diodes 15.

The fuses 61 are configured to be blown due to high current flowing in the voltage detection lines when the Zener diodes 15 are short-circuited. Specifically, the rated current of the fuses 61 is set based on the high current flowing in the voltage detection lines when the Zener diodes 15 are short-circuited due to an overvoltage applied thereto. Consequently, with the blowing of the fuses 61, it is possible to prevent the high current from flowing to the monitoring IC chip 13.

As shown in FIG. 1, the monitoring IC chip 13 includes a driver 18 that performs signal processing such as amplification and a plurality of switches 19 respectively corresponding to the battery cells 220. It should be noted that for the sake of simplicity, only one of the switches 19 is depicted in FIG. 1.

Each of the switches 19 is provided to control the electrical connection between one adjacent pair of the voltage detection lines that are arranged in order of electric potential. Specifically, each of the switches 19 has one end connected with a wiring of the monitoring IC chip 13 which is connected to one of the adjacent pair of the voltage detection lines and the other end connected with another wiring of the monitoring IC chip 13 which is connected to the other of the adjacent pair of the voltage detection lines. Consequently, it is possible to control charge/discharge of that one of the battery cells 220 which is electrically connected between the adjacent pair of the voltage detection lines by controlling the on/off of the switch 19.

As shown in FIG. 1, the monitoring IC chip 13 is electrically with each of the voltage detection lines. Consequently, to the monitoring IC chip 13, there is inputted each of the output voltages of the battery cells 220. The monitoring IC chip 13 monitors the output voltages (or electromotive forces) of the battery cells 220 inputted thereto and outputs the monitoring results to the battery ECU 300.

For each of the battery cells 220, there is a correlation between the SOC (State of Charge) of the battery cell 220 and the electromotive force of the battery cell 220. The battery ECU 300 stores the correlation therein. Moreover, the battery ECU 300 determines, for each of the battery cells 220, the SOC of the battery cell 220 on the basis of the output voltage (or electromotive force) of the battery cell 220 inputted thereto from the monitoring IC chip 13 and the correlation stored therein.

Then, based on the determined SOCs of the battery cells 220, the battery ECU 300 further determines whether it is necessary to perform the process of balancing the SOCs of the battery cells 220. When the result of the determination is affirmative, i.e., when it is necessary to perform the process of balancing the SOCs of the battery cells 220, the battery ECU 300 outputs the command signal to the driver 18 of the monitoring IC chip 13.

Upon receipt of the command signal, the driver 18 of the monitoring IC chip 13 performs the process of balancing the SOCs of the battery cells 220 by controlling the on/off of the switches 19 respectively corresponding to the battery cells 220.

Furthermore, the battery ECU 300 also determines, based on the output voltages of the battery cells 220 inputted thereto from the monitoring IC chip 13, the SOC of the entire battery stack 210. Then, the battery ECU 300 outputs the determined SOC of the battery stack 210 to the in-vehicle ECUs. Based on the SOC of the battery stack 210, vehicle information detected by various sensors provided in the hybrid vehicle and the on/off state of an ignition switch of the hybrid vehicle, the in-vehicle ECUs output command signals to the battery ECU 300. Here, the vehicle information includes, for example, the amount of depression of an accelerator pedal of the hybrid vehicle and the opening degree of a throttle valve of the hybrid vehicle. Based on the command signals outputted from the in-vehicle ECUs, the battery ECU 300 controls the electrical connection between the battery stack 210 and the electrical loads.

More specifically, though not shown in the figures, between the battery stack 210 and the electrical loads, there is provided a system main relay. The system main relay is configured to create a magnetic field. The battery ECU 300 controls the creation of the magnetic field by the system main relay, thereby controlling the electrical connection between the battery stack 210 and the electrical loads.

(Configuration of Wiring Unit)

Figure 4:
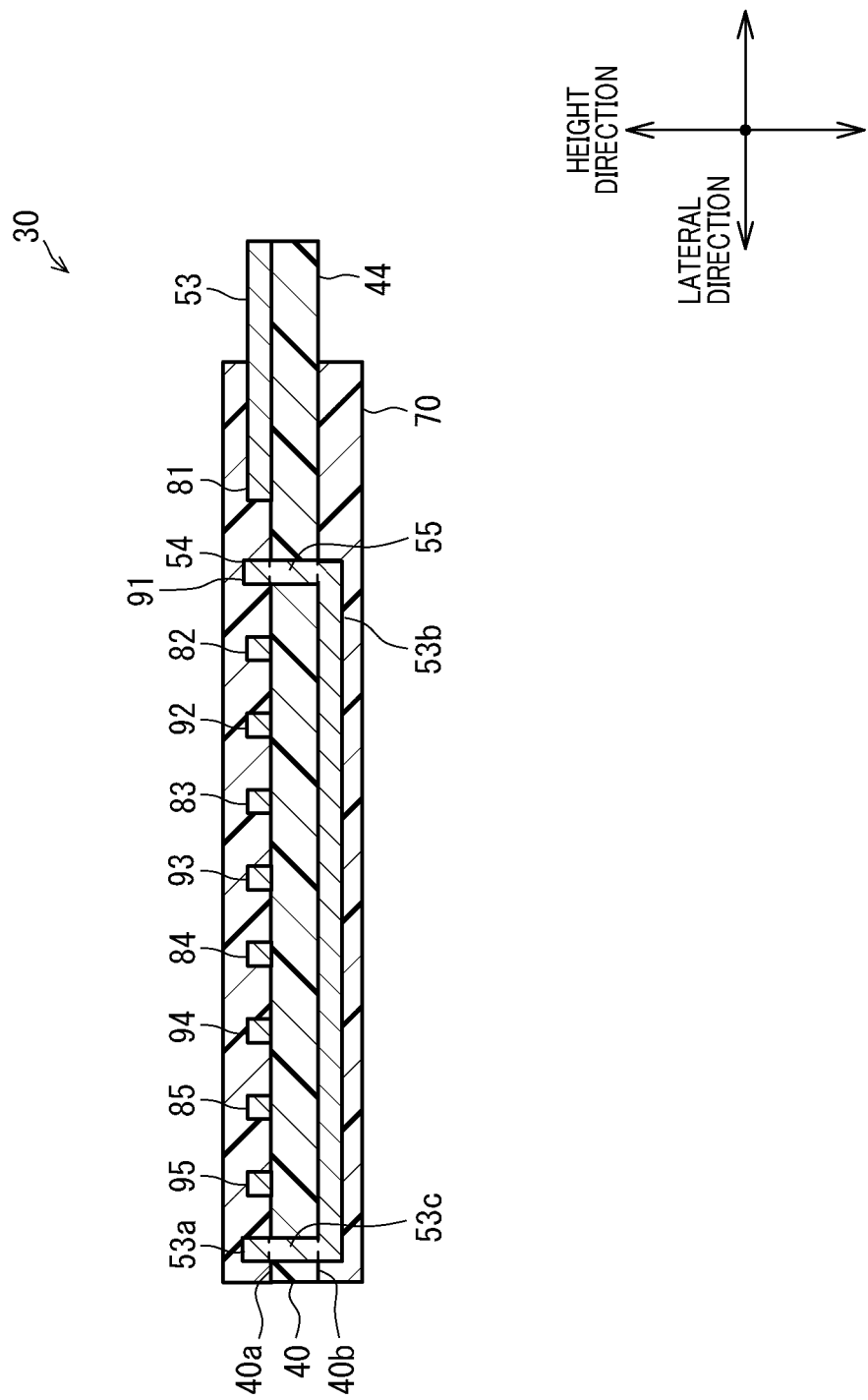
FIG. 4 is a cross-sectional view taken along the line IV-IV in FIG. 3.
Figure 5:
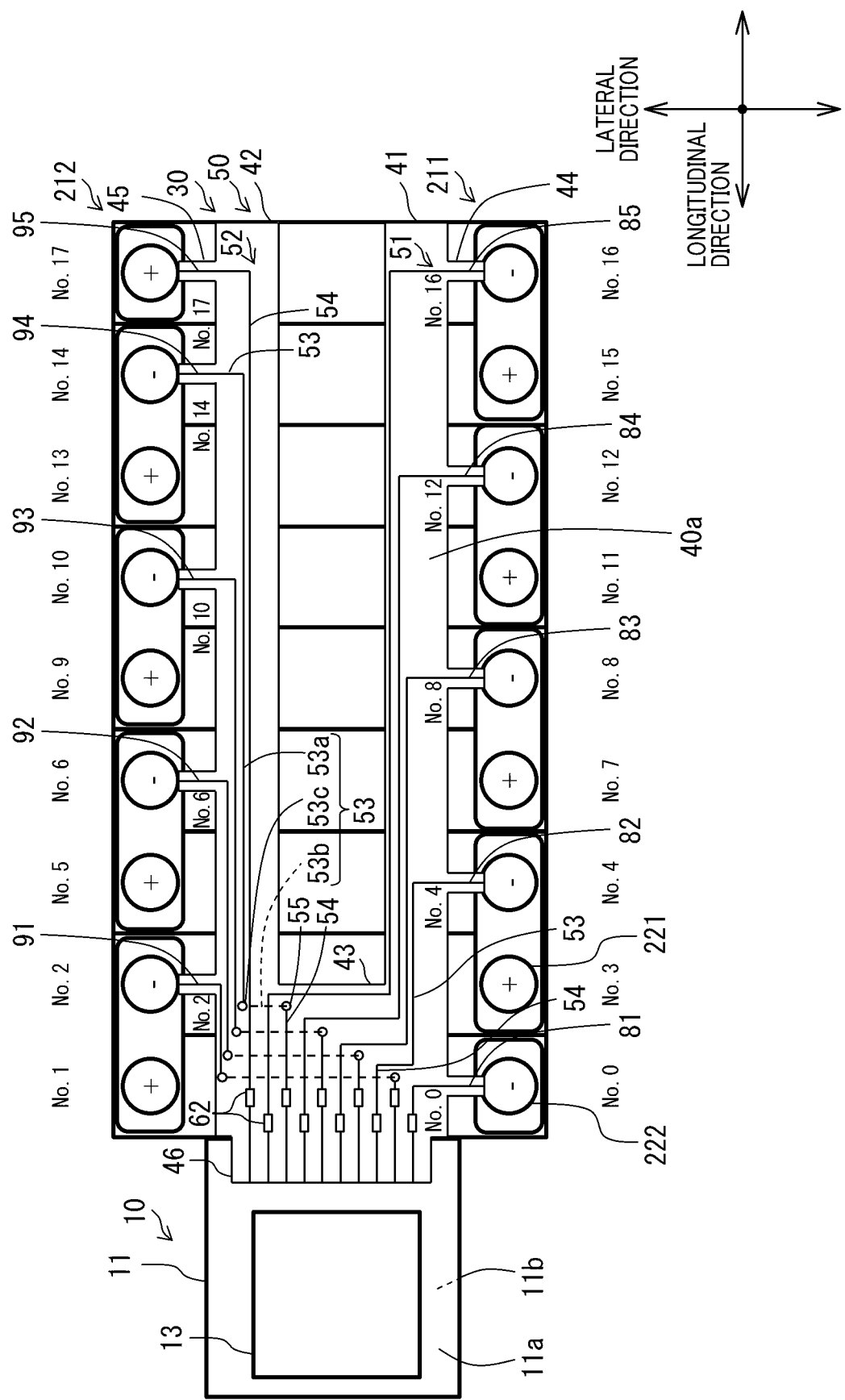
FIG. 5 is a schematic top view illustrating the monitoring apparatus according to the first embodiment arranged on the battery stack.

As shown in FIGS. 3-5, the wiring unit 30 includes the flexible substrate 40 and the wiring patterns 50. The flexible substrate 40 has a smaller thickness than the printed board 11 and is formed of a flexible resin material. Therefore, the flexible substrate 40 is capable of being bent. In other words, the flexible substrate 40 is capable of being elastically deformed.

Moreover, though not shown in the figures, to allow large deformation in the longitudinal direction and the lateral direction, part of the flexible substrate 40 may have cuts formed therein or may be formed to have a bellows structure. Furthermore, to prevent flow of the cooling air in the receiving space formed in the battery case from being impeded by the flexible substrate 40, there may be formed in the flexible substrate 40 cuts or holes that penetrate the flexible substrate 40 in the height direction.

As shown in FIG. 5, the flexible substrate 40 is provided between the first and second electrode-terminal groups 211 and 212 of the battery stack 210. Therefore, the maximum lateral width of the flexible substrate 40 is smaller than the interval between the first and second electrode-terminal groups 211 and 212 in the lateral direction.

The flexible substrate 40 is comprised of a first flexible substrate 41, a second flexible substrate 42 and a third flexible substrate 43. Each of the first, second and third flexible substrates 41-43 has a rectangular shape longer in the longitudinal direction than in the lateral direction. The length of each of the first and second flexible substrates 41 and 42 in the longitudinal direction is set according to the length of the battery stack 210 in the longitudinal direction. On the other hand, the length of the third flexible substrate 43 in the longitudinal direction is set to be smaller than the length of each of the first and second flexible substrates 41 and 42 in the longitudinal direction.

The third flexible substrate 43 is located between the first and second flexible substrates 41 and 42. The first and second flexible substrates 41 and 42 are formed integrally with each other via the third flexible substrate 43. It should be noted that the boundaries between the third flexible substrate 43 and the first and second flexible substrates 41 and 42 are shown with one-dot chain lines in FIG. 3. In addition, the length of the third flexible substrate 43 in the longitudinal direction is set in consideration of the connection strength between the third flexible substrate 43 and each of the first and second flexible substrates 41 and 42 and a space necessary for arranging the wiring patterns 50 in order of electric potential as will be described in detail later.

As shown in FIG. 5, the first flexible substrate 41 is arranged adjacent to the first electrode-terminal group 211 while the second flexible substrate 42 is arranged adjacent to the second electrode-terminal group 212. The third flexible substrate 43 is located between monitoring unit 10-side parts of the first and second flexible substrates 41 and 42 to connect them into one piece.

With the above configuration, the flexible substrate 40 as a whole is substantially U-shaped on a plane defined by the longitudinal and lateral directions. In addition, the third flexible substrate 43 may alternatively be located away from the monitoring unit 10-side ends of the first and second flexible substrates 41 and 42 in the longitudinal direction so that the flexible substrate 40 as a whole is substantially H-shaped on the plane defined by the longitudinal and lateral directions.

The wiring patterns 50 include first wiring patterns 51 electrically connecting the first electrode-terminal group 211 to the monitoring unit 10 and second wiring patterns 52 electrically connecting the second electrode-terminal group 212 to the monitoring unit 10. The first wiring patterns 51 are formed mainly in the first flexible substrate 41 and the third flexible substrate 43. The second wiring patterns 52 are formed mainly in the second flexible substrate 42 and the third flexible substrate 43.

As shown in FIG. 5, the first wiring patterns 51 respectively electrically connect the No. 0, No. 4, No. 8, No. 12 and No. 16 negative terminals 222 of the first electrode-terminal group 211 to the wiring unit 10. On the other hand, the second wiring patterns 52 respectively electrically connect the No. 2, No. 6, No. 10 and No. 14 negative terminals 222 and No. 17 positive terminal 221 of the second electrode-terminal group 212 to the monitoring unit 10. Consequently, the wiring unit 30 and the battery stack 210 are electrically connected as shown in FIG. 1.

As an alternative, the first wiring patterns 51 may respectively electrically connect the No. 0 negative terminal 222 and the No. 3, No. 7, No. 11 and No. 15 positive terminals 221 of the first electrode-terminal group 211 to the wiring unit 10; the second wiring patterns 52 may respectively electrically connect the No. 1, No. 5, No. 9, No. 13 and No. 17 positive terminals 221 of the second electrode-terminal group 212 to the monitoring unit 10.

As another alternative, the first and second wiring patterns 51 and 52 may be respectively connected with the connecting members 223, not with the electrode terminals. Moreover, considering the voltage drops due to the resistances of the connecting members 223, it is preferable for the first and second wiring patterns 51 and 52 to be respectively connected to the centers of the connecting members 223. In other words, it is preferable for the first and second wiring patterns 51 and 52 to be respectively connected to central parts of the connecting members 223 which respectively connect positive terminal 221-side end parts and negative terminal 222-side end parts of the connecting members 223.

As shown in FIGS. 3 and 4, the first wiring patterns 51 are formed on the front surface 40a of the flexible substrate 40. The second wiring patterns 52 are formed on the front and back surfaces 40a and 40b of the flexible substrate 40 as well as inside the flexible substrate 40. Both the front and back surfaces 40a and 40b of the flexible substrate 40 are covered with a resin coating 70. It should be noted that those parts of the second wiring patterns 52 which are formed on the back surface 40b of the flexible substrate 40b are shown with dashed lines in FIGS. 3 and 5.

Each of the first and second wiring patterns 51 and 52 includes a first wiring 53 electrically connected to a corresponding one of the electrode terminals of the battery cells 220 and a second wiring 54 electrically connected to the printed board 11. Moreover, each of the second wiring patterns 52 further includes a connection wiring 55 that is formed inside the flexible board 40 so as to extend in the height direction.

In each of the first wiring patterns 51, the first wiring 53 extends from the first electrode-terminal group 211 toward the second electrode-terminal group 212. The second wiring 54 extends in the longitudinal direction from the first wiring 53 to the monitoring unit 10. More specifically, the first wiring 53 has a first end electrically connected with a corresponding one of the electrode terminals (i.e., the positive and negative terminals 221 and 222) of the battery cells 220 and a second end connected with the second wiring 54. The second wiring 54 has a first end connected with the second end of the first wiring 53 and a second end electrically connected with the monitoring unit 10.

In the first flexible substrate 41, there are formed first protrusions 44 respectively corresponding to the first wirings 53 of the first wiring patterns 51. Each of the first protrusions 44 extends in the lateral direction from that one of two lateral ends of the first flexible substrate 41 which is on the first electrode-terminal group 211 side toward a corresponding one of the electrode terminals of the battery cells 220. The first protrusions 44 are arranged at predetermined intervals in the longitudinal direction. On each of the first protrusions 44, there is arranged the first end of the first wiring 53 of a corresponding one of the first wiring patterns 51. In addition, the first ends of the first wirings 53 of the first wiring patterns 51 are exposed from the resin coating 70 (see FIG. 4).

On the other hand, in each of the second wiring patterns 52, part of the first wiring 53 is formed on the back surface 40*b* of the flexible substrate 40. The second wiring 54 is formed on the front surface 40*a* of the flexible substrate 40. The part of the first wiring 53 formed on the back surface 40*b* of the flexible substrate 40 and a first end of the second wiring 54 formed on the front surface 40*a* of the flexible substrate 40 are connected with each other via the connection wiring 55.

Specifically, in each of the second wiring patterns 52, the first wiring 53 extends from the second electrode-terminal group 212 toward the first electrode-terminal group 211. The connection wiring 55 extends in the height direction from the first wiring 53 to the second wiring 54. The second wiring 54 extends in the longitudinal direction from the connection wiring 55 to the monitoring unit 10. More specifically, the first wiring 53 has a first end electrically connected with a corresponding one of the electrode terminals of the battery cells 220 and a second end connected with the connection wiring 55. The second wiring 54 has the first end connected with the connection wiring 55 and a second end electrically connected with the monitoring unit 10.

However, as shown in FIG. 3, the second wiring pattern 52 which is connected with the No. 17 positive terminal 221 of the highest potential has a different configuration from the other second wiring patterns 52. Specifically, the second wiring pattern 52 connected with the No. 17 positive terminal 221 has both a first wiring 53 and a second wiring 54 formed on the front surface 40*a* of the flexible substrate 40. The first wiring 53 extends from the second electrode-terminal group 212 toward the first electrode-terminal group 211. The second wiring 54 extends in the longitudinal direction from the first wiring 53 to the monitoring unit 10. More specifically, the first wiring 53 has a first end electrically connected with the No. 17 positive terminal 221 of the highest potential and a second end connected with the second wiring 54. The second wiring 54 has a first end connected with the first wiring 53 and a second end electrically connected with the monitoring unit 10.

In the second flexible substrate 42, there are formed second protrusions 45 respectively corresponding to the first wirings 53 of the second wiring patterns 52. Each of the second protrusions 45 extends in the lateral direction from that one of two lateral ends of the second flexible substrate 42 which is on the second electrode-terminal group 212 side toward a corresponding one of the electrode terminals of the battery cells 220. The second protrusions 45 are arranged at predetermined intervals in the longitudinal direction. On each of the second protrusions 45, there is arranged the first end of the first wiring 53 of a corresponding one of the second wiring patterns 52. In addition, the first ends of the first wirings 53 of the second wiring patterns 52 are exposed from the resin coating 70.

As shown in FIG. 3, in the flexible substrate 40 that is comprised of the first, second and third flexible substrates 41-43, there is formed a projection 46 that projects in the longitudinal direction from a monitoring unit 10-side end of the flexible substrate 40 to the monitoring unit 10. On the projection 46, there are arranged the second ends of the second wirings 54 of the first and second wiring patterns 51 and 52. The projection 46 is connected with a front surface 11*a* of the printed board 11. Alternatively, the projection 46 may be connected with a back surface 11*b* of the printed board 11. The projection 46 is capable of being bent according to the arrangement of the printed board 11. The second ends of the second wirings 54 of the first and second wiring patterns 51 and 52, which are arranged on the projection 46, are exposed from the resin coating 70.

It should be noted that in FIG. 3, to represent that the reference numeral 11*b* designates the back surface of the printed board 11, that part of the leader line of the reference numeral 11*b* which overlaps the printed board 11 is shown with a dashed line.

(Shapes and Positions of Wiring Patterns)

For the sake of convenience of explanation, hereinafter, the first electrode-terminal group 211 side and the second electrode-terminal group 212 side in the lateral direction will be respectively referred to as the lower side and the upper side; the No. 0 negative electrode 222 side (or the monitoring unit 10 side) and the No. 17 positive electrode 221 side (or the opposite side to the monitoring unit 10) in the longitudinal direction will be respectively referred to as the left side and the right side.

As shown in FIGS. 3 and 5, the first wiring patterns 51 include first to fifth lower wiring patterns 81-85 that are respectively connected to the No. 0, No. 4, No. 8, No. 12 and No. 16 negative terminals 222 of the first electrode-terminal group 211. The No. 0, No. 4, No. 8, No. 12 and No. 16 negative terminals 222 are arranged in this order from the left side to the right side in the longitudinal direction. That is, these five electrode terminals are arranged in order of increasing electric potential from the left side to the right side in the longitudinal direction. Accordingly, the first wirings 53 of the first to the fifth lower wiring patterns 81-85 are sequentially arranged from the left side to the right side in the longitudinal direction.

The first wiring 53 of the first lower wiring pattern 81 extends upward in the lateral direction from the lower end of the corresponding first protrusion 44 to a position in the first flexible substrate 41 closer to the third flexible substrate 43. That is, the first wiring 53 of the first lower wiring pattern 81 is formed on the front surface 40*a* of the flexible substrate 40 into the shape of a straight line.

In each of the second to the fifth lower wiring patterns 82-85, the first wiring 53 extends first upward in the lateral direction from the lower end of the corresponding first protrusion 44 to a position in the first flexible substrate 41, then leftward in the longitudinal direction in the first flexible substrate 41, and thereafter upward in the lateral direction to the third flexible substrate 43. That is, in each of the second to the fifth lower wiring patterns 82-85, the first wiring 53 is formed on the front surface 40*a* of the flexible substrate 40 into the shape of a crank.

The lengths of those parts of the first wirings 53 of the lower wiring patterns 82-85 which extend upward in the lateral direction from the lower ends of the corresponding first protrusions 44 increase in the order of the second lower wiring pattern 82, the third lower wiring pattern 83, the fourth lower wiring pattern 84 and the fifth lower wiring pattern 85.

The lengths of those parts of the first wirings 53 of the lower wiring patterns 82-85 which extend in the longitudinal direction also increase in the order of the second lower wiring pattern 82, the third lower wiring pattern 83, the fourth lower wiring pattern 84 and the fifth lower wiring pattern 85. In addition, the left ends (i.e., the monitoring unit 10-side ends) of those parts of the first wirings 53 of the lower wiring patterns 82-85 which extend in the longitudinal direction are arranged from the left side to the right side in the order of the second lower wiring pattern 82, the third lower wiring pattern 83, the fourth lower wiring pattern 84 and the fifth lower wiring pattern 85.

The lengths of those parts of the first wirings 53 of the lower wiring patterns 82-85 which extend, on the monitoring unit 10 side, upward in the lateral direction to the third flexible substrate 43 also increase in the order of the second lower wiring pattern 82, the third lower wiring pattern 83, the fourth lower wiring pattern 84 and the fifth lower wiring pattern 85. Consequently, the upper ends (i.e., the second flexible substrate 42-side ends) of those parts of the first wirings 53 of the lower wiring patterns 82-85 which extend, on the monitoring unit 10 side, upward in the lateral direction to the third flexible substrate 43 are arranged from the lower side to the upper side in the order of the second lower wiring pattern 82, the third lower wiring pattern 83, the fourth lower wiring pattern 84 and the fifth lower wiring pattern 85. In addition, the upper ends of those parts of the first wirings 53 of the lower wiring patterns 82-85 which extend, on the monitoring unit 10 side, upward in the lateral direction to the third flexible substrate 43 are respectively connected with the second wirings 54 of the lower wiring patterns 82-85.

The second wirings 54 of the lower wiring patterns 82-85 extend leftward in the longitudinal direction respectively from the first wirings 53 of the lower wiring patterns 82-85 to the projection 46 of the flexible substrate 40. Consequently, the second wirings 54 of the lower wiring patterns 82-85 are arranged from the lower side to the upper side in the lateral direction in the order of the second lower wiring pattern 82, the third lower wiring pattern 83, the fourth lower wiring pattern 84 and the fifth lower wiring pattern 85.

In addition, the boundary between the first and second wirings 53 and 54 of the first lower wiring pattern 81 is located below the boundary between the first and second wirings 53 and 54 of the second lower wiring pattern 82. Consequently, the second wiring 54 of the first lower wiring pattern 81 is located below the second wiring 54 of the second lower wiring pattern 82.

Accordingly, in the present embodiment, the second wirings 54 of all the lower wiring patterns 81-85 are arranged from the lower side to the upper side in the lateral direction in the order of the first lower wiring pattern 81, the second lower wiring pattern 82, the third lower wiring pattern 83, the fourth lower wiring pattern 84 and the fifth lower wiring pattern 85. In other words, the second wirings 54 of all the lower wiring patterns 81-85 are arranged from the lower side to the upper side in the lateral direction in order of increasing electric potential.

As shown in FIGS. 3 and 5, the second wiring patterns 52 include first to fifth upper wiring patterns 91-95 that are respectively connected to the No. 2, No. 6, No. 10 and No. 14 negative terminals 222 and No. 17 positive terminal 221 of the second electrode-terminal group 212. The No. 2, No. 6, No. 10 and No. 14 negative terminals 222 and No. 17 positive terminal 221 are arranged in this order from the left side to the right side in the longitudinal direction. That is, these five electrode terminals are arranged in order of increasing electric potential from the left side to the right side in the longitudinal direction. Accordingly, the first wirings 53 of the first to the fifth upper wiring patterns 91-95 are sequentially arranged from the left side to the right side in the longitudinal direction.

In each of the first to the fourth upper wiring patterns 91-94, the first wiring 53 extends first downward in the lateral direction from the upper end of the corresponding second protrusion 45 to a position in the second flexible substrate 42, then leftward in the longitudinal direction in the second flexible substrate 42, and thereafter downward in the lateral direction to the third flexible substrate 43. Specifically, both that part of the first wiring 53 which extends downward in the lateral direction from the upper end of the corresponding second protrusion 45 and that part of the first wiring 53 which extends leftward in the longitudinal direction are formed on the front surface 40a of the flexible substrate 40. On the other hand, that part of the first wiring 53 which extends downward in the lateral direction to the third flexible substrate 43 is formed on the back surface 40b of the flexible substrate 40.

For the sake of convenience of explanation, hereinafter, those parts of the first wiring 53 which are formed on the front surface 40a of the flexible substrate 40 will be together referred to as the front wiring 53a; that part of the first wiring 53 which is formed on the back surface 40b of the flexible substrate 40 will be referred to as the back wiring 53b. As shown in FIG. 4, the front wiring 53a and the back wiring 53b are electrically connected with each other via an internal wiring 53c formed inside the second flexible substrate 42. The front wiring 53a is formed on the front surface 40a of the flexible substrate 40 into an L-shape (see FIG. 2) while the back wiring 53b is formed on the back surface 40b of the flexible substrate 40 into the shape of a straight line (see FIG. 4). The internal wiring 53c is formed into the shape of a straight line extending in the height direction (see FIG. 4).

As shown in FIG. 3, the lengths of those parts of the front wirings 53a of the upper wiring patterns 91-94 which extend downward in the lateral direction from the upper ends of the corresponding second protrusions 45 increase in the order of the first upper wiring pattern 91, the second upper wiring pattern 92, the third upper wiring pattern 93 and the fourth upper wiring pattern 94.

The lengths of those parts of the front wirings 53a of the upper wiring patterns 91-94 which extend in the longitudinal direction also increase in the order of the first upper wiring pattern 91, the second upper wiring pattern 92, the third upper wiring pattern 93 and the fourth upper wiring pattern 94.

The internal wirings 53c of the upper wiring patterns 91-94 are respectively connected with the monitoring unit 10-side ends (i.e., the left ends) of those parts of the front wirings 53a of the upper wiring patterns 91-94 which extend in the longitudinal direction. The internal wirings 53c of the upper wiring patterns 91-94 are arranged from the left side to the right side in the longitudinal direction in the order of the first upper wiring pattern 91, the second upper wiring pattern 92, the third upper wiring pattern 93 and the fourth upper wiring pattern 94.

The lengths of the back wirings 53b of the upper wiring patterns 91-94 decrease in the order of the first upper wiring pattern 91, the second upper wiring pattern 92, the third upper wiring pattern 93 and the fourth upper wiring pattern 94.

The connection wirings 55 of the upper wiring patterns 91-94 are respectively connected with the first flexible substrate 41-side ends (i.e., the lower ends) of the back wirings 53b of the upper wiring patterns 91-94. The connection wirings 55 of the upper wiring patterns 91-94 are arranged from the lower side to the upper side in the lateral direction in the order of the first upper wiring pattern 91, the second upper wiring pattern 92, the third upper wiring pattern 93 and the fourth upper wiring pattern 94. Moreover, to the connection wirings 55 of the upper wiring patterns 91-94, there are respectively connected the first ends of the second wirings 54 of the upper wiring patterns 91-94.

The second wirings 54 of the upper wiring patterns 91-94 extend leftward in the longitudinal direction respectively from the connection wirings 55 of the upper wiring patterns 91-94 to the projection 46 of the flexible substrate 40. Consequently, the second wirings 54 of the upper wiring patterns 91-94 are arranged from the lower side to the upper side in the lateral direction in the order of the first upper wiring pattern 91, the second upper wiring pattern 92, the third upper wiring pattern 93 and the fourth upper wiring pattern 94.

The fifth upper wiring pattern 95 is formed on the front surface 40*a* of the flexible substrate 40. The first wiring 53 of the fifth upper wiring pattern 95 extends downward in the lateral direction from the upper end of the corresponding second protrusion 45. The second wiring 54 of the fifth upper wiring pattern 95 extends leftward in the longitudinal direction from the first wiring 53 of the fifth upper wiring pattern 95 to the projection 46 of the flexible substrate 40. Consequently, the fifth upper wiring pattern 95 as a whole is formed on the front surface 40*a* of the flexible substrate 40 into an L-shape.

The first wiring 53 of the fifth upper wiring pattern 95 extends more downward (i.e., more toward the first flexible substrate 41) in the lateral direction than the front wiring 53*a* of the fourth upper wiring pattern 94. Moreover, the second wiring 54 of the fifth upper wiring pattern 95 is located upward of the second wiring 54 of the fourth upper wiring pattern 94.

Accordingly, in the present embodiment, the second wirings 54 of all the upper wiring patterns 91-95 are arranged from the lower side to the upper side in the lateral direction in the order of the first upper wiring pattern 91, the second upper wiring pattern 92, the third upper wiring pattern 93, the fourth upper wiring pattern 94 and the fifth upper wiring pattern 95. In other words, the second wirings 54 of all the upper wiring patterns 91-95 are arranged from the lower side to the upper side in the lateral direction in order of increasing electric potential.

As described above, the back wirings 53*b* of the second wiring patterns 52 (i.e., the first to the fourth upper wiring patterns 91-94) are formed on the back surface 40*b* of the flexible substrate 40 to extend in the lateral direction. On the other hand, the second wirings 54 of the first and second wiring patterns 51 and 52 (i.e., the first to the fifth lower wiring patterns 81-85 and the first to the fifth upper wiring patterns 91-95) are formed on the front surface 40*a* of the flexible substrate 40 to extend in the longitudinal direction. That is, the back wirings 53*b* of the second wiring patterns 52 cross the second wirings 54 of the first and second wiring patterns 51 and 52. Consequently, the back wirings 53*b* of the second wiring patterns 52 are opposed to the second wirings 54 of the first and second wiring patterns 51 and 52 in the height direction with the flexible substrate 40 interposed therebetween.

More specifically, as shown with dashed lines in FIG. 3, the back wiring 53*b* of the first upper wiring pattern 91 extends in the lateral direction to cross each of the second wirings 54 of the second to the fifth lower wiring patterns 82-85 and the second to the fifth upper wiring patterns 92-95. The connection wiring 55 of the first upper wiring pattern 91 is formed between the first and second lower wiring patterns 81 and 82 in the lateral direction. Accordingly, the second wiring 54 of the first upper wiring pattern 91 is located between the second wirings 54 of the first and second lower wiring patterns 81 and 82 in the lateral direction. Consequently, the second wirings 54 of the three wiring patterns 81, 91 and 82 respectively corresponding to the No. 0, No. 2 and No. 4 electrode terminals of the battery cells 220 are arranged from the lower side to the upper side in the lateral direction in order of increasing electric potential.

The back wiring 53*b* of the second upper wiring pattern 92 extends in the lateral direction to cross each of the second wirings 54 of the third to the fifth lower wiring patterns 83-85 and the third to the fifth upper wiring patterns 93-95. The connection wiring 55 of the second upper wiring pattern 92 is formed between the second and third lower wiring patterns 82 and 83 in the lateral direction. Accordingly, the second wiring 54 of the second upper wiring pattern 92 is located between the second wirings 54 of the second and third lower wiring patterns 82 and 83 in the lateral direction. Consequently, the second wirings 54 of the three wiring patterns 82, 92 and 83 respectively corresponding to the No. 4, No. 6 and No. 8 electrode terminals of the battery cells 220 are arranged from the lower side to the upper side in the lateral direction in order of increasing electric potential.

The back wiring 53*b* of the third upper wiring pattern 93 extends in the lateral direction to cross each of the second wirings 54 of the fourth and fifth lower wiring patterns 84 and 85 and the fourth and fifth upper wiring patterns 94 and 95. The connection wiring 55 of the third upper wiring pattern 93 is formed between the third and fourth lower wiring patterns 83 and 84 in the lateral direction. Accordingly, the second wiring 54 of the third upper wiring pattern 93 is located between the second wirings 54 of the third and fourth lower wiring patterns 83 and 84 in the lateral direction. Consequently, the second wirings 54 of the three wiring patterns 83, 93 and 84 respectively corresponding to the No. 8, No. 10 and No. 12 electrode terminals of the battery cells 220 are arranged from the lower side to the upper side in the lateral direction in order of increasing electric potential.

The back wiring 53*b* of the fourth upper wiring pattern 94 extends in the lateral direction to cross each of the second wirings 54 of the fifth lower wiring pattern 85 and the fifth upper wiring pattern 95. The connection wiring 55 of the fourth upper wiring pattern 94 is formed between the fourth and fifth lower wiring patterns 84 and 85 in the lateral direction. Accordingly, the second wiring 54 of the fourth upper wiring pattern 94 is located between the second wirings 54 of the fourth and fifth lower wiring patterns 84 and 85 in the lateral direction. Consequently, the second wirings 54 of the three wiring patterns 84, 94 and 85 respectively corresponding to the No. 12, No. 14 and No. 16 electrode terminals of the battery cells 220 are arranged from the lower side to the upper side in the lateral direction in order of increasing electric potential.

Moreover, as described above, the second wiring 54 of the fifth upper wiring pattern 95 is located upward of the second wiring 54 of the fourth upper wiring pattern 94 in the lateral direction. Consequently, the second wirings 54 of the two wiring patterns 85 and 95 respectively corresponding to the No. 16 and No. 17 electrode terminals of the battery cells 220 are arranged from the lower side to the upper side in the lateral direction in order of increasing electric potential.

As above, in the present embodiment, the second wirings 54 of the ten wiring patterns 50 respectively corresponding to the No. 0, No. 2, No. 4, No. 6, No. 8, No. 10, No. 12, No.

14, No. 16 and No. 17 electrode terminals of the battery cells 220 are arranged from the lower side to the upper side in the lateral direction in order of increasing electric potential. Accordingly, the ten board wirings 14 (see FIG. 1), which are respectively electrically with the second wirings 54 of the ten wiring patterns 50, are also arranged from the lower side to the upper side in the lateral direction in order of increasing electric potential.

(Arrangement of Inductors)

As described above, in the flexible substrate 40, there are provided the inductors 62 that function as noise removal elements to remove noise during detection of the voltages of the battery cells 220. More specifically, the inductors 62 serve to remove noise inputted to those parts of the wiring patterns 50 which are located closer than the inductors 62 to the battery cells 200. Therefore, it is preferable to provide the inductors 62 in the wiring patterns 50 so as to be close to the monitoring unit 10, not to the battery cells 220.

In view of the above, in the present embodiment, each of the inductors 62 is provided in a corresponding one of the wiring patterns 50 so as to be located on the monitoring unit 10 side of the center of the corresponding wiring pattern 50.

More particularly, in the present embodiment, as shown in FIG. 3, each of the inductors 62 is provided in the second wiring 54 of the corresponding wiring pattern 50, not in the first wring 53 of the corresponding wiring pattern 50. More specifically, each of the inductors 62 is provided in a part of the second wiring 54 of the corresponding wiring pattern 50 located in a region where the second wirings 54 of all the wiring patterns 50 are arranged in the lateral direction in order of electric potential (i.e., in a region where the second wirings 54 of all the wiring patterns 50 overlap each other in the lateral direction). In other words, each of the inductors 62 is provided in a part of the second wiring 54 of the corresponding wiring pattern 50 which is located closest to the monitoring unit 10 in the second wiring 54. That is, each of the inductors 62 is provided in the second wiring 54 of the corresponding wiring pattern 50 so as to be located on the monitoring unit 10 side of a part of the second wiring 54 which is opposed to at least one of the back wirings 53b of the second wiring patterns 52 in the height direction with the flexible substrate 40 interposed therebetween.

As shown in FIG. 3, the five inductors 62 respectively provided in the first to the fifth lower wiring patterns 81-85 are aligned with each other in the lateral direction. On the other hand, the five inductors 62 respectively provided in the first to the fifth upper wiring patterns 91-95 are aligned with each other in the lateral direction. Moreover, the five inductors 62 respectively provided in the first to the fifth lower wiring patterns 81-85 are located in the longitudinal direction closer than the five inductors 62 respectively provided in the first to the fifth upper wiring patterns 91-95 to the monitoring unit 10. In addition, the five inductors 62 respectively provided in the first to the fifth lower wiring patterns 81-85 are arranged alternately with the five inductors 62 respectively provided in the first to the fifth upper wiring patterns 91-95 in the lateral direction. Consequently, all the ten inductors 62 are arranged in the lateral direction in a staggered fashion (or in a zigzag fashion).

(Operational Effects)

As described above, in the present embodiment, each of the inductors 62 is provided in the second wiring 54 (i.e., a monitoring IC chip 13-side part) of the corresponding wiring pattern 50, not in the first wring 53 (i.e., an electrode terminal-side part) of the corresponding wiring pattern 50.

With the above configuration, compared to the case of providing each of the inductors 62 in the first wring 53 of the corresponding wiring pattern 50, the length from the inductor 62 to the monitoring unit 10-side end (i.e., the monitoring IC chip 13-side end) of the corresponding wiring pattern 50 is shortened. Consequently, noise is suppressed from being inputted to that part of the corresponding wiring pattern 50 which is located between the inductor 62 and the monitoring unit 10-side end of the corresponding wiring pattern 50.

In addition, with the above configuration, the length from the inductor 62 to the electrode terminal-side end of the corresponding wiring pattern 50 is increased. Consequently, it becomes easier for noise to be inputted to that part of the corresponding wiring pattern 50 which is located between the inductor 62 and the electrode terminal-side end of the corresponding wiring pattern 50. However, even if noise is inputted to that part of the corresponding wiring pattern 50 which is located between the inductor 62 and the electrode terminal-side end of the corresponding wiring pattern 50, it is possible to remove the noise with the inductor 62.

Accordingly, with the above configuration, it is possible to suppress input of noise to the monitoring unit 10 (i.e., to the monitoring IC chip 13). As a result, it is possible to suppress the accuracy of the monitoring of the voltages of the battery cells 220 by the monitoring unit 10 from being lowered due to noise.

In recent years, with the spread of hybrid and electric vehicles, outputs of battery packs have been increasing; thus, the number of battery cells included in each battery stack has been increasing. Moreover, efforts have been made to minimize the size of the battery cells so as to suppress increase in the volume of each battery pack due to increase in the number of the battery cells.

With the above recent trend of technology development, the number of wiring patterns formed on each flexible substrate has been increasing accordingly. Moreover, there is a trend of reducing the widths in the lateral direction of those flexible substrates each of which is provided between a first electrode-terminal group and a second electrode-terminal group. Accordingly, there is a trend of increasing the density of wiring patterns formed on each flexible substrate and thus a trend of reducing the lateral intervals between the wiring patterns.

Figure 6:
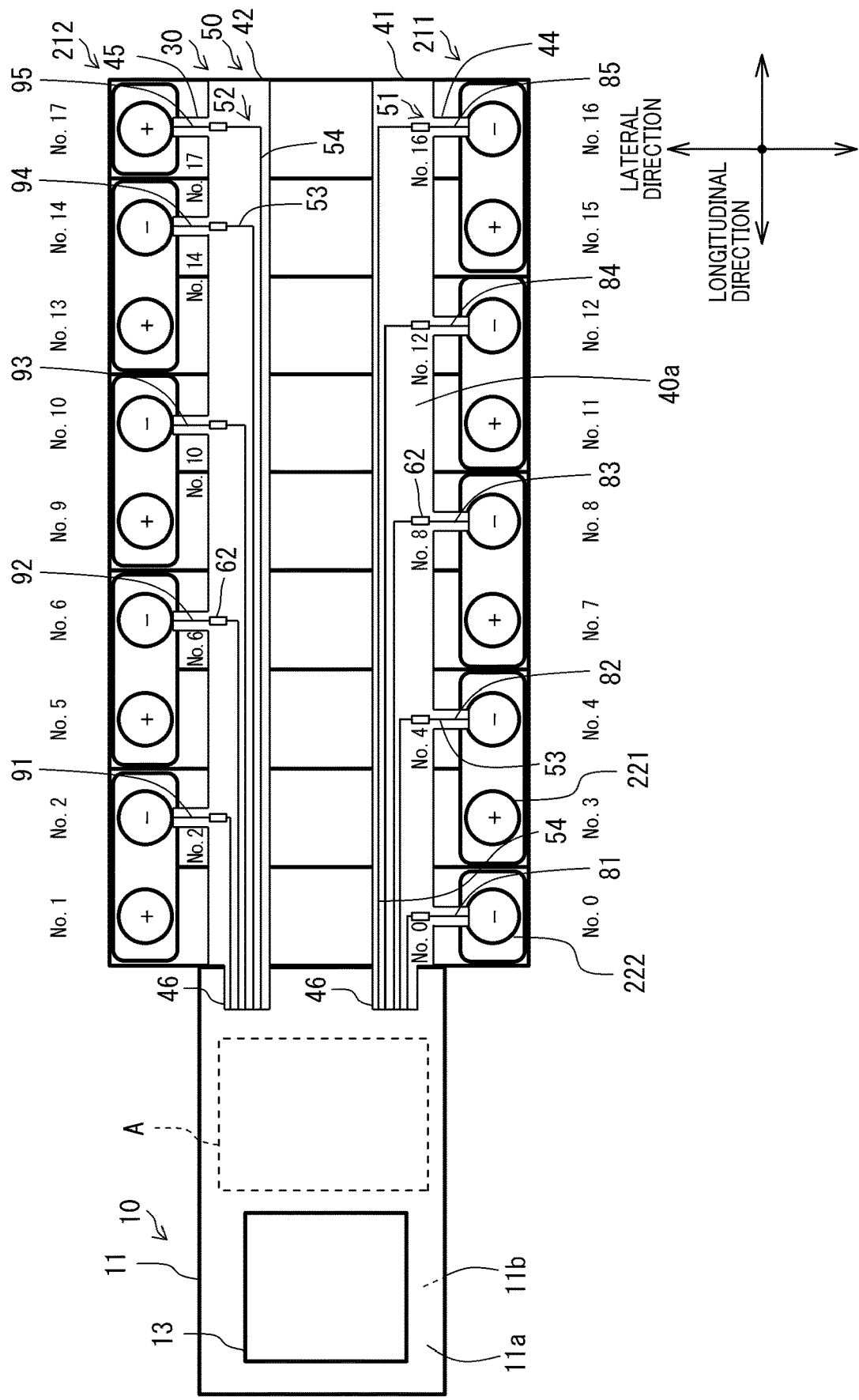
FIG. 6 is a schematic top view illustrating the configuration of a monitoring apparatus according to a comparative example.

For example, as shown in FIG. 6, in the case of configuring a flexible substrate 40 to include only a first flexible substrate 41 and a second flexible substrate 42 for saving the manufacturing cost, the lateral intervals between wiring patterns 50 formed on the flexible substrate 40 become extremely small. Consequently, it becomes difficult to provide inductors 62 respectively in monitoring unit 10-side parts of the wiring patterns 50. Therefore, in this case, the inductors 62 are provided respectively in electrode terminal-side parts of the wiring patterns 50. More particularly, according to the disclosure of Japanese Patent Application Publication No. JP2017027831A, current-limiting elements are provided respectively in busbar-side parts (or electrode terminal-side parts) of the voltage detection lines.

In contrast, in the present embodiment, the flexible substrate 40 is configured to include, in addition to the first and second flexible substrates 41 and 42, the third flexible substrate 43 that is located between the monitoring unit 10-side parts (i.e., monitoring IC chip 13-side parts) of the first and second flexible substrates 41 and 42 to connect them into one piece.

With the above configuration, the total lateral width of a monitoring unit 10-side part of the flexible substrate 40 (i.e., the sum of the lateral widths of the first, second and third flexible substrates 41-43) is increased, thereby allowing the lateral intervals between the wiring patterns 50 on the monitoring unit 10-side part of the flexible substrate 40 to be increased. As a result, it becomes easy to provide the inductors 62 respectively in the second wirings 54 (i.e., monitoring unit 10-side parts) of the wiring patterns 50.

In the present embodiment, the inductors 62 are arranged in the lateral direction in a staggered fashion.

With the above arrangement, compared to the case of arranging all the inductors 62 in alignment with each other in the lateral direction, it becomes possible to make the lateral intervals between the second wirings 54 of the wiring patterns 50 less dependent on the size of the inductors 62. Consequently, it becomes possible suppress the number of the second wirings 54 of the wiring patterns 50 formed on the flexible substrate 40 from being reduced for providing the inductors 62 respectively in the second wirings 54.

In the present embodiment, the third flexible substrate 43 is formed only between the monitoring unit 10-side parts of the first and second flexible substrates 41 and 42. Therefore, the longitudinal length of the third flexible substrate 43 is smaller than each of the longitudinal lengths of the first and second flexible substrates 41 and 42.

Consequently, compared to the case of setting the longitudinal length of the third flexible substrate 43 to be equal to each of the longitudinal lengths of the first and second flexible substrates 41 and 42, it becomes possible to reduce the volume of the entire flexible substrate 40, thereby reducing the manufacturing cost.

As described above, to perform the process of balancing the SOCs of the battery cells 220, each of the switches 19 is provided to control the electrical connection between one adjacent pair of the voltage detection lines that are arranged in order of electric potential. Therefore, to connect the switches 19 in the above manner, it is necessary for the voltage detection lines connected to the monitoring IC chip 13 to be arranged in order of electric potential. That is, it is necessary for the board wirings 14 to be arranged in order of electric potential.

Moreover, as described above, between each adjacent pair of the voltage detection lines (or the board wirings 14) that are arranged in order of electric potential, there are connected one of the Zener diodes 15 and one of the capacitors 16 in parallel with each other. Therefore, to connect the Zener diodes 15 and the capacitors 16 in the above manner, it is also necessary for the board wirings 14 to be arranged in order of electric potential.

To sum up, to perform the process of balancing the SOCs of the battery cells 220, allow each of the Zenner diodes 15 to be short-circuited between one adjacent pair of the voltage detection lines when an overvoltage is applied thereto and realize removable of noise by the RC circuits formed of the resistors 17 and the capacitors 16, it is necessary for the board wirings 14 to be arranged in order of electric potential.

However, as shown in FIG. 6, in the case of configuring the flexible substrate 40 to have the first and second flexible substrates 41 and 42 separated from each other in the lateral direction, it is impossible to arrange all the first and second wiring patterns 51 and 52 in the lateral direction in order of electric potential on the flexible substrate 40. Therefore, in this case, it is necessary to change the arrangement of the board wirings 14 in the region A enclosed with a dashed line in FIG. 6. Consequently, in this case, the size of the printed board 11 and thus the size of the entire monitoring unit 10 may be increased.

In contrast, in the present embodiment, the flexible substrate 40 is configured to have the first and second flexible substrates 41 and 42 connected integrally with each other via the third flexible substrate 43. Moreover, the first wiring patterns 51 are formed on the front surface 40a of the flexible substrate 40. The first wirings 53 of the first wiring patterns 51 extend from the first flexible substrate 41 to the third flexible substrate 43. The second wirings 54 of the first wiring patterns 51 are arranged on the third flexible substrate 43 from the lower side to the upper side (i.e., from the first electrode-terminal group 211 side to the second electrode-terminal group 212 side) in order of increasing electric potential. On the other hand, the second wiring patterns 52 have their respective back wirings 53b formed on the back surface 40b of the flexible substrate 40 to extend from the second flexible substrate 42 to the third flexible substrate 41. The second wirings 54 of the second wiring patterns 52 are formed on the front surface 40a of the flexible substrate 40 and arranged on the third flexible substrate 43 from the lower side to the upper side in order of increasing electric potential. Furthermore, the second wirings 54 of the first wiring patterns 51 are arranged alternately with the second wirings 54 of the second wiring patterns 52 in the lateral direction. Consequently, all the ten second wirings 54 of the first and second wiring patterns 51 and 52, which are respectively connected with the No. 0, No. 2, No. 4, No. 6, No. 8, No. 10, No. 12, No. 14, No. 16 and No. 17 electrode terminals of the battery cells 220, are arranged from the lower side to the upper side in the lateral direction in order of increasing electric potential. Accordingly, all the ten board wirings 14, which are respectively electrically with the ten second wirings 54 of the first and second wiring patterns 51 and 52, are also arranged from the lower side to the upper side in the lateral direction in order of increasing electric potential.

As above, in the present embodiment, it is unnecessary to change the arrangement of the board wirings 14. Accordingly, it is also unnecessary to provide the region A shown in FIG. 6 in the printed board 11. Consequently, it becomes possible to suppress increase in the size of the printed board 11 and thus increase in the size of the entire monitoring unit 10.

As described above, in the present embodiment, the first wiring patterns 51 corresponding to the first electrode-terminal group 211 are extended from the first flexible substrate 41 to the third flexible substrate 43 on the front surface 40a of the flexible substrate 40 whereas the second wiring patterns 52 corresponding to the second electrode-terminal group 212 are extended from the second flexible substrate 42 to the third flexible substrate 43 on the back surface 40b of the flexible substrate 40. Consequently, it becomes possible to arrange all the second wirings 54 of the first and second wiring patterns 51 and 52 from the lower side to the upper side in the lateral direction in increasing order of the electric potentials of the electrode terminals of the battery cells 220 respectively connected to the first and second wiring patterns 51 and 52.

As described above, in the present embodiment, the board wirings 14 are arranged in the lateral direction in order of electric potential. Therefore, the difference in electric potential between each adjacent pair of the board wirings 14 is substantially equal to the output voltage of one battery cell 220. Consequently, it becomes possible to suppress increase in the insulation distance between each adjacent pair of the board wirings 14. As a result, it becomes possible to suppress increase in the size of the printed board 11.

In the present embodiment, the back wirings 53b of the second wiring patterns 52 are opposed to the second wirings 54 of the first and second wiring patterns 51 and 52 in the height direction with the flexible substrate 40 interposed therebetween. Therefore, the spacing for insulation (or insulation distance) between the back wirings 53b of the second wiring patterns 52 and the second wirings 54 of the first and second wiring patterns 51 and 52 depends on the thickness of the flexible board 40 in the height direction. On the other hand, to ensure the flexibility of the flexible substrate 40, the thickness of the flexible substrate 40 is set to be smaller than the thickness of the printed board 11. Consequently, interference may occur between the back wirings 53b of the second wiring patterns 52 and the second wirings 54 of the first and second wiring patterns 51 and 52, causing noise to be inputted to the second wirings 54.

In view of the above, in the present embodiment, each of the inductors 62 is provided in the second wiring 54 of the corresponding wiring pattern 50 so as to be located on the monitoring unit 10 side (i.e., the monitoring IC chip 13 side) of that part of the second wiring 54 which is opposed to at least one of the back wirings 53b of the second wiring patterns 52 in the height direction with the flexible substrate 40 interposed therebetween. Consequently, even if noise is inputted to the second wirings 54 of the first and second wiring patterns 51 and 52 due to interference between the second wirings 54 and the back wirings 53b, it is possible to remove the noise with the inductors 62 and thereby prevent the noise from being further inputted to the monitoring unit 11.

[First Modification]

In the previous embodiment, in each of the first to the fourth upper wiring patterns 91-94, part of the first wiring 53 is formed as the back wiring 53b on the back surface 40b of the flexible substrate 40. Moreover, the entire fifth upper wiring pattern 95 is formed on the front surface 40a of the flexible substrate 40 (see FIG. 3).

Figure 7:
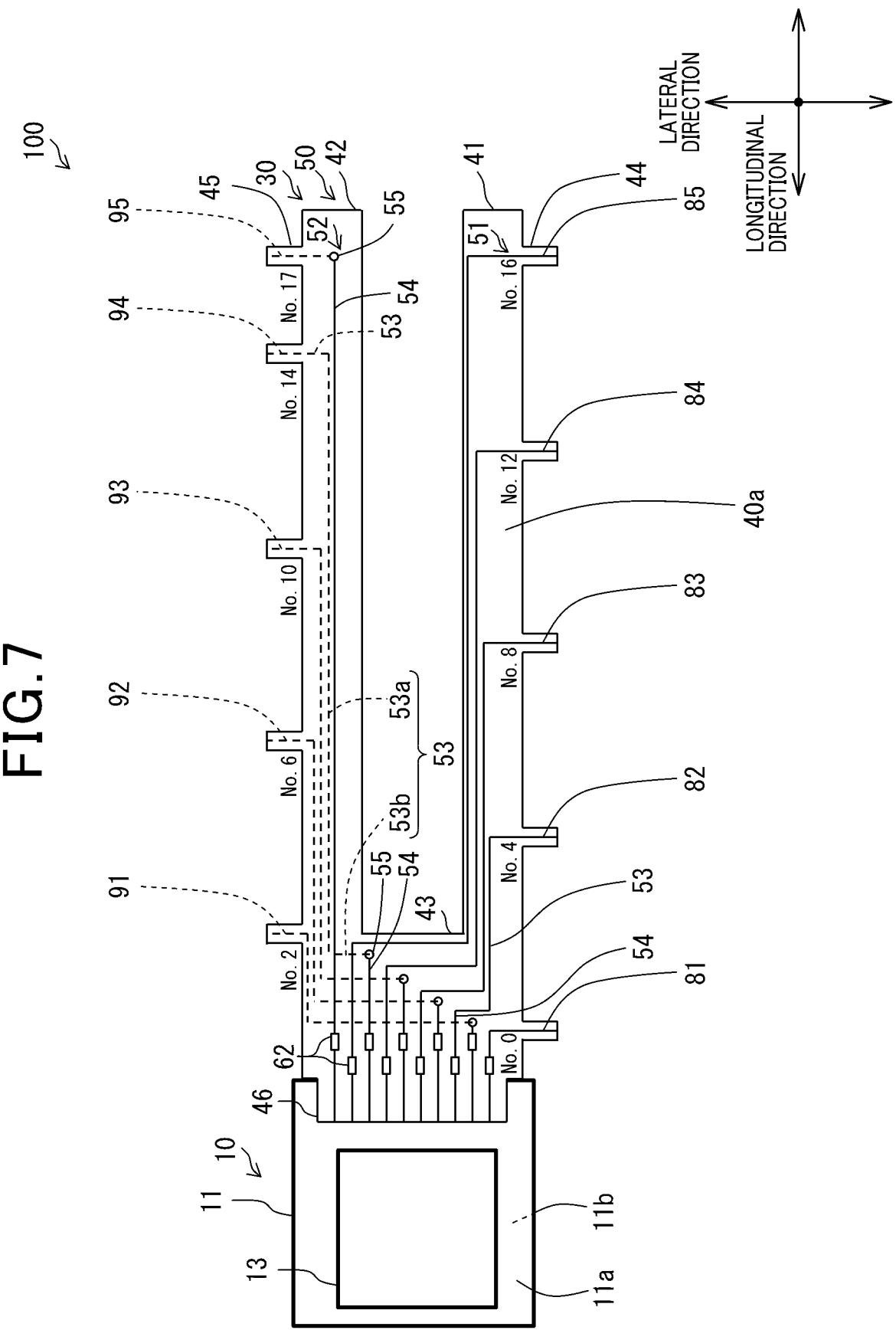
FIG. 7 is a schematic top view of a monitoring apparatus according to a first modification.

In contrast, in this modification, as shown in FIG. 7, in each of the first to the fourth upper wiring patterns 91-94, the entire first wiring 53 is formed as the back wiring 53b on the back surface 40b of the flexible substrate 40. Consequently, it becomes unnecessary to provide an internal wiring 53c as shown in FIG. 4 in each of the first to the fourth upper wiring patterns 91-94. As a result, it becomes possible to simplify the manufacturing process of the flexible substrate 40.

Moreover, in this modification, in the fifth upper wiring pattern 95, the first wiring 53 is formed on the back surface 40b of the flexible substrate 40 whereas the second wiring 54 is formed on the front surface 40a of the flexible substrate 40.

[Second Modification]

In the previous embodiment, all the second wirings 54 of the lower wiring patterns 81-85 and upper wiring patterns 91-95 are arranged from the lower side to the upper side in the lateral direction in order of increasing electric potential (see FIG. 3).

Figure 8:
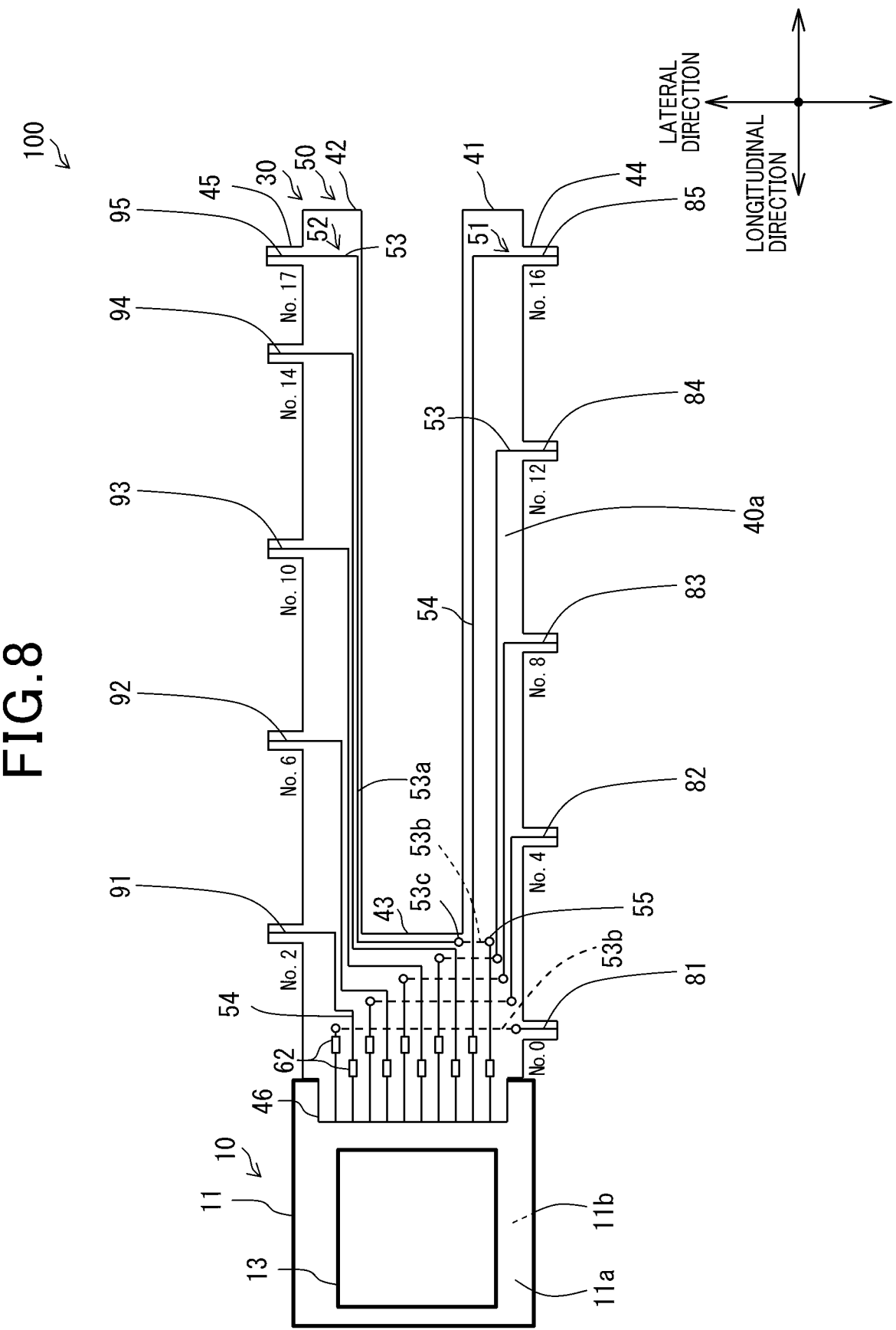
FIG. 8 is a schematic top view of a monitoring apparatus according to a second modification.

In contrast, in this modification, as shown in FIG. 8, all the second wirings 54 of the lower wiring patterns 81-85 and upper wiring patterns 91-95 are arranged from the lower side to the upper side in the lateral direction in order of decreasing electric potential.

Moreover, in this modification, in each of the first to the fourth lower wiring patterns 81-84 and the fifth upper wiring pattern 95, part of the first wiring 53 is formed as a back wiring 53b on the back surface 40b of the flexible substrate 40.

In addition, though not shown in the figures, it may be possible to: (1) form, for each of the first wiring patterns 51, part of the first wiring 53 of the first wiring pattern 51 on one of the front and back surfaces 40a and 40b of the flexible substrate 40; and (2) form, for each of the second wiring patterns 52, part of the first wiring 53 of the second wiring pattern 52 on the other of the front and back surfaces 40a and 40b of the flexible substrate 40. Further, it may be possible to: (3) arrange those parts of the first wirings 53 of the first wiring patterns 51 which are formed on the one of the front and back surfaces 40a and 40b of the flexible substrate 40 to cross those parts of the first wirings 53 of the second wiring patterns 52 which are formed on the other of the front and back surfaces 40a and 40b; and (4) set the lateral lengths of the first wirings 53 of the first and second wiring patterns 51 and 52 so as to have all the second wirings 54 of the first and second wiring patterns 51 and 52 arranged in the lateral direction in order of electric potential.

[Third Modification]

In the previous embodiment, the third flexible substrate 43 is formed only between the monitoring unit 10-side parts of the first and second flexible substrates 41 and 42. Therefore, the longitudinal length of the third flexible substrate 43 is smaller than each of the longitudinal lengths of the first and second flexible substrates 41 and 42 (see FIG. 3).

Figure 9:
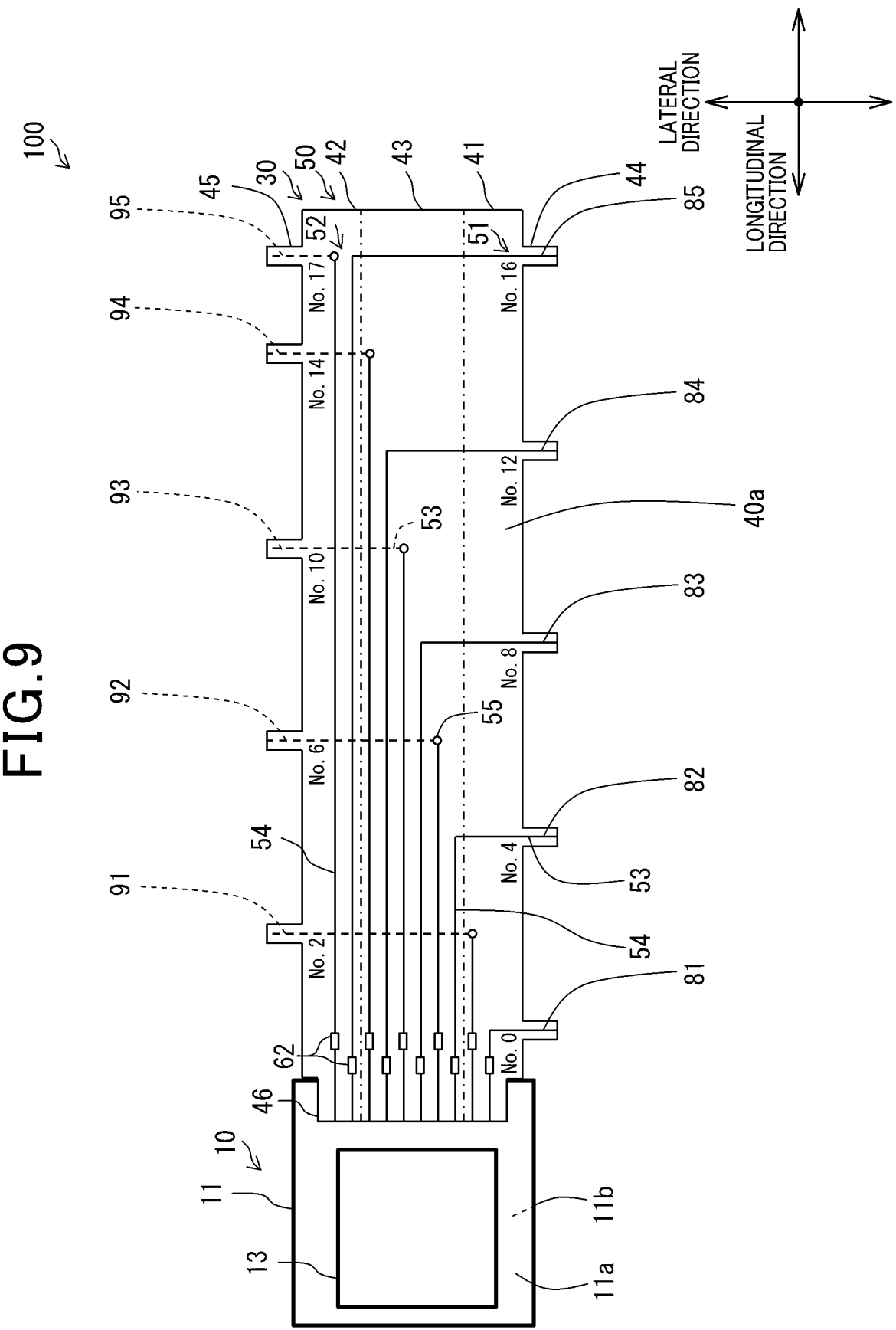
FIG. 9 is a schematic top view of a monitoring apparatus according to a third modification.

In contrast, in this modification, as shown in FIG. 9, the third flexible substrate 43 is formed between the entire first flexible substrate 41 and the entire second flexible substrate 42. Therefore, the longitudinal length of the third flexible substrate 43 is equal to each of the longitudinal lengths of the first and second flexible substrates 41 and 42.

Consequently, in this modification, both the front and back surfaces 40a and 40b of the flexible substrate 40 are rectangular-shaped, thereby allowing the arrangement of the wiring patterns 50 on the flexible substrate 40 to be simplified. More specifically, in this modification, each of the wiring patterns 50 is L-shaped, on the plane defined by the longitudinal and lateral directions, to have its first wiring 53 extending only in the lateral direction and its second wiring 54 extending only in the longitudinal direction. It should be noted that the boundaries between the third flexible substrate 43 and the first and second flexible substrates 41 and 42 are shown with one-dot chain lines in FIG. 9.

Moreover, in this modification, in each of the second wiring patterns 52, the entire first wiring 53 is formed on the back surface 40b of the flexible substrate 40.

Figure 10:
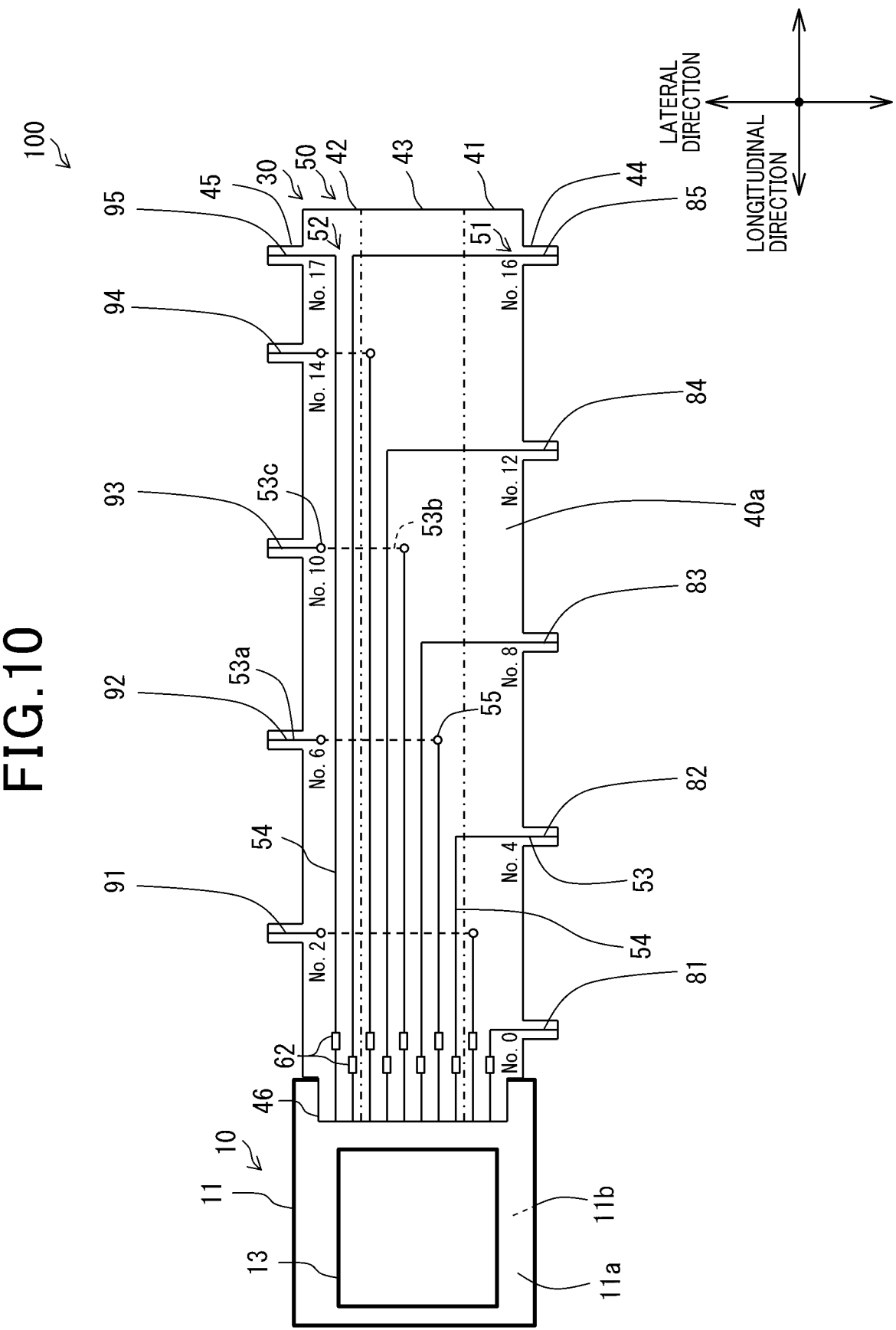
FIG. 10 is a schematic top view of another monitoring apparatus according to the third modification.

As an alternative, as shown in FIG. 10, it may be possible to form only part of each of the first wirings 53 of the first to the fourth upper wiring patterns 91-94 on the back surface 40b of the flexible substrate 40.

[Fourth Modification]

In the previous embodiment, in each of the wiring patterns 50, the entire second wiring 54 is formed to extend straight in the longitudinal direction (see FIG. 3).

Figure 11:
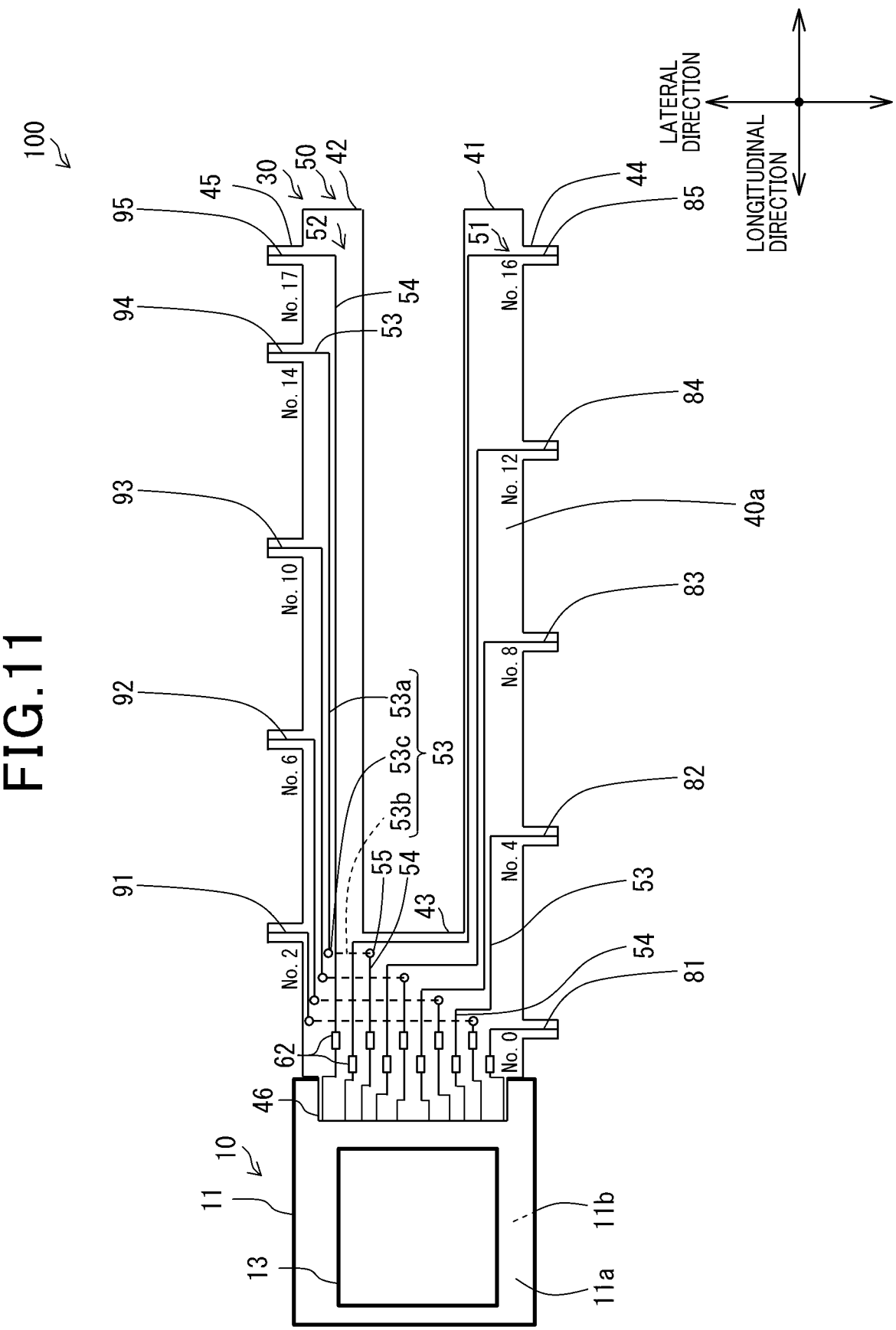
FIG. 11 is a schematic top view of a monitoring apparatus according to a fourth modification.

In contrast, in this modification, as shown in FIG. 11, in each of the lower wiring patterns 81-85, a part of the second wiring 54 on the monitoring unit 10 side (i.e., monitoring IC chip 13 side) of the inductor 62 is offset downward in the lateral direction from the remainder of the second wiring 54. On the other hand, in each of the upper wiring patterns 91-95, a part of the second wiring 54 on the monitoring unit 10 side of the inductor 62 is offset upward in the lateral direction from the remainder of the second wiring 54.

Consequently, in this modification, the intervals between the monitoring unit 10-side parts of the second wirings 54 of the wiring patterns 50 in the lateral direction are increased, thereby suppressing interference between each adjacent pair of the monitoring unit 10-side parts of the second wirings 54.

[Fifth Modification]

In the previous embodiment, on the flexible substrate 40, there are provided the second electronic elements 60 which include the fuses 61 and the inductors 62. Moreover, the inductors 62 function as the noise removal elements to remove noise during detection of the voltages of the battery cells 220 (see FIGS. 1 and 3).

Figure 12:
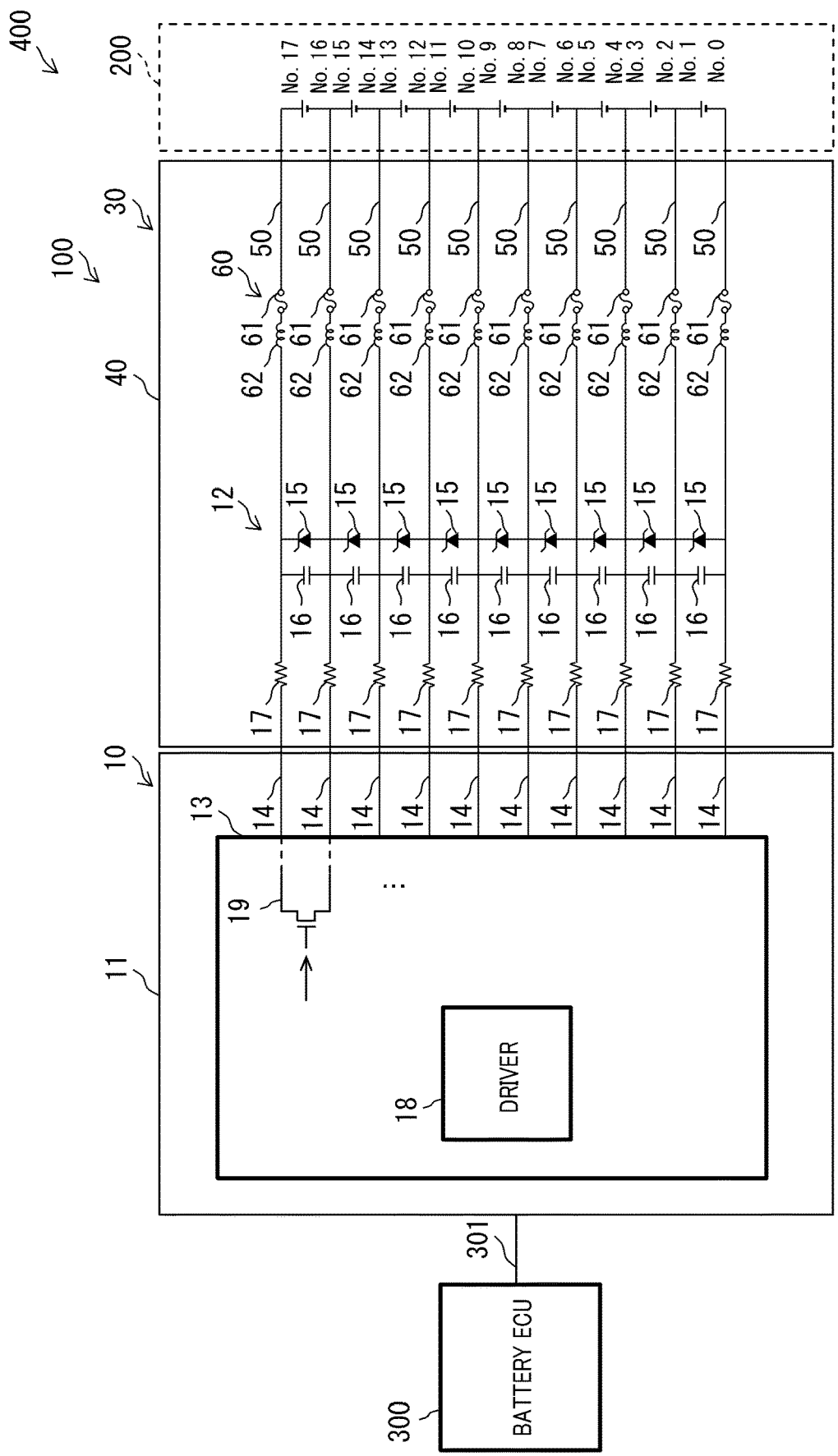
FIG. 12 is a schematic circuit diagram of a battery pack which includes a monitoring apparatus according to a fifth modification.

In contrast, in this modification, as shown in FIG. 12, on the flexible substrate 40, there are provided, in addition to the second electronic elements 60, the first electronic elements 12 which include the Zener diodes 15, the capacitors 16 and the resistors 17.

Consequently, in this modification, the RC circuits formed of the resistors 17 and the capacitors 16 also function as noise removal elements to remove noise during detection of the voltages of the battery cells 220.

In addition, as described in the previous embodiment, all the second wirings 54 of the wiring patterns 50 are arranged in the lateral direction in order of electric potential. Therefore, it is possible to provide the Zener diodes 15 and the capacitors 16 on the flexible substrate 40 instead of the printed board 11.

[Sixth Modification]

In the previous embodiment, the flexible substrate 40 is configured to include the first, second and third flexible substrates 41, 42 and 43. Moreover, on the flexible substrate 40, all the second wirings 54 of the wiring patterns 50 are arranged in the lateral direction in order of electric potential.

As an alternative, the second wirings 54 of the wiring patterns 50 may be arranged, on the flexible substrate 40 which includes the first, second and third flexible substrates 41, 42 and 43, in the lateral direction not in order of electric potential.

As another alternative, the second wirings 54 of the wiring patterns 50 may be arranged, on the flexible substrate 40 which is configured to include only the first and second flexible substrates 41 and 42, in the lateral direction not in order of electric potential.

[Seventh Modification]

In the previous embodiment, all the ten inductors 62 are arranged in the lateral direction in a staggered fashion (see FIG. 3).

As an alternative, all the ten inductors 62 may be arranged in alignment with each other in the lateral direction.

Second Embodiment

A monitoring apparatus 100 according to the second embodiment has a similar configuration as the monitoring apparatus 100 according to the first embodiment. Therefore, the differences therebetween will be mainly described hereinafter.

In the first embodiment, the flexible substrate 40 is configured to include the first, second and third flexible substrates 41, 42 and 43. Moreover, the printed board 11 is opposed to neither of the first and second flexible substrates 41 and 42 in the height direction. Furthermore, the printed board 11 is not located between the first and second electrode-terminal groups 211 and 212 in the lateral direction (see FIGS. 3 and 5).

Figure 13:
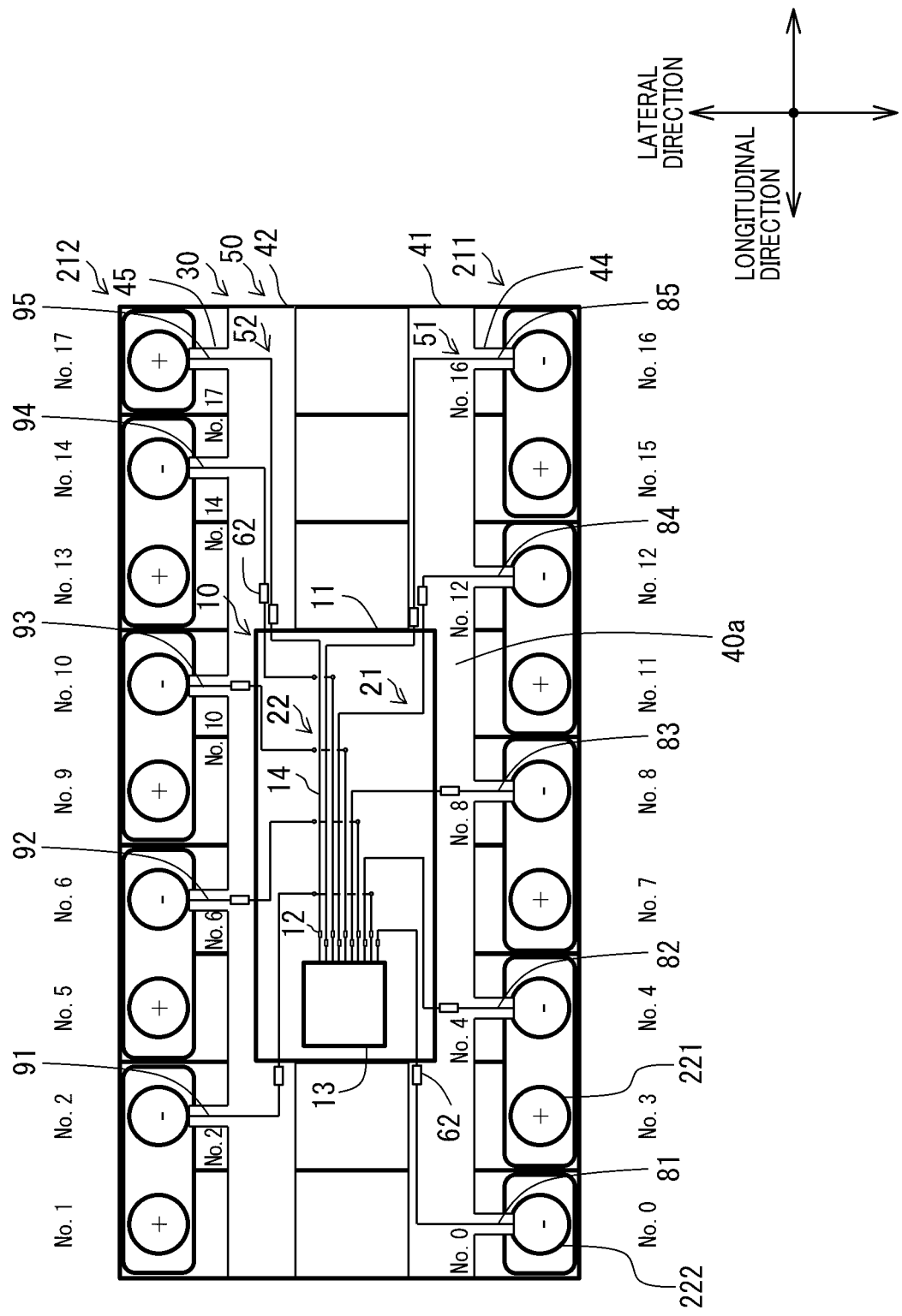
FIG. 13 is a schematic top view illustrating the configuration of a monitoring apparatus according to a second embodiment.

In contrast, in the present embodiment, as shown in FIGS. 13 and 14, the flexible substrate 40 is configured to include only the first and second flexible substrates 41 and 42. Moreover, the printed board 11 is provided in the battery stack 210 so that lower and upper parts of the printed board 11 are respectively opposed to the first and second flexible substrates 41 and 42 in the height direction (i.e., the direction perpendicular to the paper surface of FIG. 13). Furthermore, the printed board 11 is located between the first and second electrode-terminal groups 211 and 212 in the lateral direction.

With the above configuration, it becomes possible to reduce both the sizes of the monitoring apparatus 100 in the longitudinal and lateral directions (or both the lengths and widths of the monitoring apparatus 100).

In the present embodiment, as shown in FIG. 13, the first wiring patterns 51 are provided on the first flexible substrate 41. Each of the first wiring patterns 51 extends upward from a corresponding one of the electrode terminals of the first electrode-terminal group 211 to the printed board 11. Moreover, for each of the first wiring patterns 51, there is provided one of the inductors 62 in a printed board 11-side end part of the first wiring pattern 51.

On the other hand, the second wiring patterns 52 are provided on the second flexible substrate 42. Each of the second wiring patterns 52 extends downward from a corresponding one of the electrode terminals of the second electrode-terminal group 212 to the printed board 11. Moreover, for each of the second wiring patterns 52, there is provided one of the inductors 62 in a printed board 11-side end part of the second wiring pattern 52.

In addition, as an alternative, the inductors 62 may be provided on the printed board 11. More specifically, the inductors 62 may be provided respectively in fourth wirings 24 (to be described later) formed on the printed board 11.

As shown in FIG. 13, each of the board wirings 14 is electrically connected with a corresponding one of the first and second wiring patterns 51 and 52. That is, the board wirings 14 include first board wirings 21 respectively connected with the first wiring patterns 51 and second board wirings 22 respectively connected with the second wiring patterns 52.

Each of the first and second board wirings 21 and 22 includes a third wiring 23 connected with the corresponding wring pattern 50 (i.e., first wiring pattern 51 or second wiring pattern 52) and a fourth wiring 24 connected with the monitoring IC chip 13 (more specifically, with the driver 18).

For each of the first board wirings 21, both the third and fourth wirings 23 and 24 of the first board wiring 21 are formed on a front surface 11a of the printed board 11. On the other hand, for each of the second board wirings 22, part of the third wiring 23 of the second board wiring 22 is formed on a back surface 11b of the printed board 11; the remainder of the second board wiring 22 and the fourth wiring 24 of the second board wiring 22 are formed on the front surface 11a of the printed board 11.

The third wirings 23 of the first board wirings 21 extend from the first flexible substrate 41 toward the second flexible substrate 42 side so that the boundaries between the third and fourth wirings 23 and 24 of the first board wirings 21 are arranged from the lower side to the upper side in the lateral direction in order of increasing electric potential. The fourth wirings 24 of the first board wirings 21 extend respectively from the third wirings 23 of the first board wirings 21 to the monitoring IC chip 13 (more specifically, to the driver 18) in the longitudinal direction.

The third wirings 23 of the second board wirings 22 extend from the second flexible substrate 42 toward the first flexible substrate 41 side so that the boundaries between the third and fourth wirings 23 and 24 of the second board wirings 22 are arranged from the lower side to the upper side in the lateral direction in order of increasing electric potential. The fourth wirings 24 of the second board wirings 22 extend respectively from the third wirings 23 of the second board wirings 22 to the monitoring IC chip 13 (more specifically, to the driver 18) in the longitudinal direction.

Moreover, in the present embodiment, as shown with dashed lines in FIG. 14, for each of the second board wirings 22, a fourth wiring 24-side part of the third wiring 23 of the second board wiring 22 is formed on the back surface 11b of the printed board 11 to extend in the lateral direction. On the other hand, all the fourth wirings 24 of the first and second board wirings 21 and 22 are formed on the front surface 11a of the printed board 11 to extend in the longitudinal direction. That is, the fourth wiring 24-side parts of the third wirings 23 of the second board wirings 22 formed on the back surface 11b of the printed board 11 cross the fourth wirings 24 of the first and second board wirings 21 and 22 formed on the front surface 11a of the printed board 11. Consequently, the fourth wiring 24-side parts of the third wirings 23 of the second board wirings 22 are opposed to the fourth wirings 24 of the first and second board wirings 21 and 22 in the height direction via the printed board 11 interposed therebetween.

In addition, the fourth wiring 24-side parts of the third wirings 23 of the second board wirings 22 formed on the back surface 11b of the printed board 11 are respectively electrically connected with the fourth wirings 24 of the second board wirings 22 formed on the front surface 11a of the printed board 11 via connection vias 25 formed inside the printed board 11. Moreover, the fourth wiring 24-side parts of the third wirings 23 of the second board wirings 22 formed on the back surface 11b of the printed board 11 are respectively electrically connected with the remaining parts of the third wirings 23 of the second board wirings 22 formed on the front surface 11a of the printed board 11 via connection vias 26 formed inside the printed board 11.

The arrangement of the board wirings 14 according to the present embodiment is similar to the arrangement of the wiring patterns 50 according to the first embodiment.

That is, in the present embodiment, all the fourth wirings 24 of the board wirings 14 are arranged from the lower side to the upper side in the lateral direction in order of increasing electric potential. Moreover, in the fourth wirings 24 of the board wirings 14, there are provided the first electronic elements 12 which include the Zener diodes 15, the capacitors 16 and the resistors 17.

More specifically, in the present embodiment, the Zener diodes 15, the capacitors 16 and the resistors 17 are provided on the monitoring IC chip 13 side of those parts of the fourth wirings 24 of the board wirings 14 which are opposed in the height direction to the fourth wiring 24-side parts of the third wirings 23 of the second board wirings 22 formed on the back surface 11b of the printed board 11. In addition, in the present embodiment, the RC circuits formed of the resistors 17 and the capacitors 16 function as noise removal elements to remove noise during detection of the voltages of the battery cells 220.

As described above, in the present embodiment, the RC circuits formed of the resistors 17 and the capacitors 16 are provided in the fourth wirings 24 (i.e., monitoring IC chip 13-side parts) of the board wirings 14, not in the third wirings 24 (i.e., wiring pattern 50-side parts) of the board wirings 14.

With the above configuration, compared to the case of providing the RC circuits in the third wirings 24, the lengths from the RC circuits to the monitoring IC chip 13-side ends of the board wirings 14 are shortened. Consequently, noise is suppressed from being inputted to those parts of the board wirings 14 which are respectively located between the RC circuits and the monitoring IC chip 13-side ends of the board wirings 14.

In addition, with the above configuration, the lengths from the RC circuits to the wiring pattern 50-side ends of the board wirings 14 are increased. Consequently, it becomes easier for noise to be inputted to those parts of the board wirings 14 which are respectively located between the RC circuits and the wiring pattern 50-side ends of the board wirings 14. However, even if noise is inputted to those parts of the board wirings 14 which are respectively located between the RC circuits and the wiring pattern 50-side ends of the board wirings 14, it is possible to remove the noise with the RC circuits.

Accordingly, with the above configuration, it is possible to suppress input of noise to the monitoring IC chip 13. As a result, it is possible to suppress the accuracy of the monitoring of the voltages of the battery cells 220 by the monitoring IC chip 13 from being lowered due to noise.

[Eighth Modification]

In the second embodiment, in each of the board wirings 14, the entire fourth wiring 24 is formed to extend straight in the longitudinal direction (see FIG. 14).

In contrast, in this modification, as shown in FIG. 15, in each of the five lower board wirings 14, a part of the fourth wiring 24 on the monitoring IC chip 13 side of the RC circuit is offset downward in the lateral direction from the remainder of the fourth wiring 24. On the other hand, in each of the five upper board wirings 14, a part of the fourth wiring 24 on the monitoring IC chip 13 side of the RC circuit is offset upward in the lateral direction from the remainder of the fourth wiring 24.

Consequently, in this modification, the intervals between the monitoring IC chip 13-side parts of the fourth wirings 24 of the board wirings 14 in the lateral direction are increased, thereby suppressing interference between each adjacent pair of the monitoring IC chip 13-side parts of the fourth wirings 24.

[Ninth Modification]

In the first embodiment, all the second wirings 54 of the wiring patterns 50 are formed on the front surface 40a of the flexible substrate 40. As an alternative, all the second wirings 54 of the wiring patterns 50 may be formed on the back surface 40b of the flexible substrate 40. In this case, the arrangement of the wiring patterns 50 is front-back inverted with respect to the arrangement of the wiring patterns 50 according to the first embodiment.

In the second embodiment, all the fourth wirings 24 of the board wirings 14 are formed on the front surface 11a of the printed board 11. As an alternative, all the fourth wirings 24 of the board wirings 14 may be formed on the back surface 11b of the printed board 11. In this case, the arrangement of the board wirings 14 is front-back inverted with respect to the arrangement of the board wirings 14 according to the second embodiment.

[Tenth Modification]

In the above-described embodiments, the battery stack 210 is formed of the nine battery cells 220. However, the number of the battery cells 220 forming the battery stack 210 may be any suitable integer greater or equal to 2.

In the above-described embodiments, the battery module 200 includes only one battery stack 210. However, the battery module 200 may alternatively include two or more battery stacks 210. In this case, in the battery case, there may be formed a plurality of receiving spaces which are arranged in the lateral direction and in which the battery stacks 210 are respectively received.

For example, in the case of the battery module 200 having two battery stacks 210 connected in series with each other, the two battery stacks 210 include the same even number of the battery cells 220. Moreover, the negative terminal 222 of the battery cell 220 arranged at the right end of one of the two battery stacks 210 and the positive terminal 221 of the battery cell 220 arranged at the right end of the other of the two battery stacks 210 are electrically connected with each other via an electric wire. Consequently, the positive terminal 221 of the battery cell 220 arranged at the left end of the one of the two battery stacks 210 has a highest electric potential whereas the negative terminal 222 of the battery cell 220 arranged at the left end of the other of the two battery stacks 210 has a lowest electric potential. The positive terminal 221 having the highest electric potential and the negative terminal 222 having the lowest electric potential are arranged in alignment with each other in the lateral direction. In addition, two monitoring unit 30 may be provided respectively for the two battery stacks 210.

While the above particular embodiments and their modifications have been shown and described, it will be understood by those skilled in the art that various further modifications, changes, and improvements may be made without departing from the spirit of the present disclosure.

For example, in the above-described embodiments, the battery pack 400 is designed to be used in a hybrid vehicle. Alternatively, the battery pack 400 may be used in a plug-in hybrid vehicle or an electric vehicle.

What is claimed is:

1. A monitoring apparatus for monitoring voltages of a plurality of battery cells electrically connected in series with each other and each including a pair of electrode terminals, the plurality of battery cells being arranged in a first direction, the monitoring apparatus comprising:
    a flexible substrate having a plurality of wiring patterns formed on the flexible substrate, the plurality of wiring patterns being electrically connected with the pair of electrode terminals of the plurality of battery cells, each of the plurality of battery cells includes, as the pair of electrode terminals thereof, a positive terminal and a negative terminal formed on a formation surface of the battery cell and aligned with each other in a second direction perpendicular to the first direction;
    a monitoring circuit electrically connected with the pair of electrode terminals of the plurality of battery cells via the plurality of wiring patterns, the monitoring circuit being configured to monitor voltages of the plurality of battery cells inputted to the monitoring circuit via the plurality of wiring patterns; and
    a plurality of noise removal elements provided in the plurality of wiring patterns to remove noise inputted to the plurality of wiring patterns, the plurality of noise removable elements being provided in monitoring circuit-side parts of the plurality of wiring patterns, wherein:
        all the pair of electrode terminals of the plurality of battery cells are classified into a first electrode-terminal group and a second electrode-terminal group that are aligned with and spaced from each other in the second direction,
        in each of the first and second electrode-terminal groups, the positive terminals of the plurality of battery cells are arranged alternately with the negative terminals of the plurality of battery cells in the first direction,
        an arrangement order of the positive terminals and the negative terminals in the first electrode-terminal group is opposite to an arrangement order of the positive terminals and the negative terminals in the second electrode-terminal group,
        the flexible substrate is provided between the first and second electrode-terminal groups to face the formation surfaces of the battery cells, and
        the flexible substrate is formed of a first flexible substrate located adjacent to the first electrode-terminal group, a second flexible substrate located adjacent to the second electrode-terminal group, and a third flexible substrate located between monitoring circuit-side parts of the first and second flexible substrates to connect the first and second flexible substrates into one piece.

2. The monitoring apparatus as set forth in claim 1, wherein a length of the third flexible substrate in the first direction is smaller than each of lengths of the first and second flexible substrates in the first direction.

3. The monitoring apparatus as set forth in claim 1, wherein:
    the plurality of wiring patterns include a plurality of first wiring patterns electrically connecting the pair of electrode terminals of the first electrode-terminal group to the monitoring circuit and a plurality of second wiring patterns electrically connecting the pair of electrode terminals of the second electrode-terminal group to the monitoring circuit,
    each of the plurality of first wiring patterns includes a first wiring electrically connected to a corresponding one of the pair of electrode terminals of the first electrode-terminal group and a second wiring electrically connected to the monitoring circuit,
    each of the plurality of second wiring patterns includes a first wiring electrically connected to a corresponding one of the pair of electrode terminals of the second electrode-terminal group and a second wiring electrically connected to the monitoring circuit,
    in each of the plurality of first wiring patterns, part of the first wiring is formed on one of a front surface and a back surface of the flexible substrate to extend from a first electrode-terminal group side to a second electrode-terminal group side,
    in each of the plurality of second wiring patterns, part of the first wiring is formed on another of the front surface and the back surface of the flexible substrate to extend from the second electrode-terminal group side to the first electrode-terminal group side,
    the plurality of second wirings of the first and second wiring patterns are arranged from one of the first electrode-terminal group side and the second electrode-terminal group side to the other one of the first electrode-terminal group side and the second electrode-terminal group side in the second direction in increasing order of electric potentials of the pair of electrode terminals respectively connected to the plurality of first and second wiring patterns, and
    the plurality of second wirings of the plurality of first wiring patterns are arranged alternately with the plurality of second wirings of the plurality of second wiring patterns in the second direction.

4. The monitoring apparatus as set forth in claim 3, wherein:
    the plurality of noise removable elements are provided respectively in the plurality of second wirings of the plurality of first and second wiring patterns, the plurality of noise removable elements provided in the plurality of second wirings of the plurality of first wiring patterns are aligned with each other in the second direction, the plurality of noise removable elements provided in the plurality of second wirings of the plurality of second wiring patterns are also aligned with each other in the second direction, the plurality of noise removable elements provided in the plurality of second wirings of the plurality of first wiring patterns are located apart from the plurality of noise removable elements provided in the plurality of second wirings of the plurality of second wiring patterns in the first direction, and the plurality of noise removable elements provided in the plurality of second wirings of the plurality of first wiring patterns are arranged alternately with the plurality of noise removable elements provided in the plurality of second wirings of the plurality of second wiring patterns in the second direction.

5. The monitoring apparatus as set forth in claim 3, wherein:

the plurality of second wirings of the plurality of first and second wiring patterns are formed on the one of the front and the back surfaces of the flexible substrate, and each of the plurality of noise removable elements is provided in the plurality of second wiring of a corresponding one of the plurality of first and the second wiring patterns so as to be located on the monitoring circuit side of a part of the second wiring that is opposed to at least one of the parts of the plurality of first wirings of the plurality of second wiring patterns formed on the other of the front and the back surfaces of the flexible substrate in a third direction with the flexible substrate interposed therebetween, the third direction being perpendicular to both the first and second directions.

6. The monitoring apparatus as set forth in claim 3, wherein intervals in the second direction between parts of the plurality of second wirings of the plurality of first and second wiring patterns that are respectively located between the plurality of noise removal elements and the monitoring circuit in the first direction are greater than intervals in the second direction between parts of the plurality of second wirings of the plurality of first and second wiring patterns that are respectively located between the plurality of noise removal elements and the plurality of first wirings of the plurality of first and second wiring patterns in the first direction.

7. The monitoring apparatus as set forth in claim 3, wherein each of the plurality of noise removal elements includes a capacitor that is electrically connected between one of the plurality of second wirings of the plurality of first wiring patterns and one of the plurality of second wirings of the plurality of second wiring patterns.

8. The monitoring apparatus as set forth in claim 1, further comprising a monitoring unit that includes a wiring board having a plurality of board wirings formed thereon, the monitoring circuit being provided on the wiring board and a plurality of switches each of which is provided to control charge and discharge of a corresponding one of the plurality of battery cells, wherein:

the plurality of board wirings are respectively connected to the pair of electrode terminals of the plurality of battery cells via the plurality of wiring patterns and arranged in order of electric potentials of the pair of electrode terminals respectively connected thereto, and each of the plurality of switches is provided between one adjacent pair of the plurality of board wirings with one end of the switch electrically connected to one of the plurality of board wirings of the adjacent pair and the other end of the switch electrically connected to the other of the plurality of board wirings of the adjacent pair.

9. The monitoring apparatus as set forth in claim 8, wherein:

the monitoring unit further includes a plurality of filters to remove noise inputted to the plurality of board wirings, the plurality of board wirings respectively connect the plurality of wiring patterns to the monitoring circuit, and the plurality of filters are provided in monitoring circuit-side parts of the plurality of board wirings.

10. The monitoring apparatus as set forth in claim 9, wherein intervals between parts of the plurality of board wirings that are respectively located between the plurality of filters and the monitoring circuit are greater than intervals between parts of the plurality of board wirings that are respectively located between the plurality of filters and the plurality of wiring patterns.

11. The monitoring apparatus as set forth in claim 9, wherein each of the plurality of filters includes a capacitor that is electrically connected between one adjacent pair of the plurality of board wirings.

12. A monitoring apparatus for monitoring voltages of a plurality of battery cells electrically connected in series with each other and each including a pair of electrode terminals, the plurality of battery cells are arranged in a first direction, the monitoring apparatus comprising:

a flexible substrate having a plurality of wiring patterns formed on the flexible substrate, the plurality of wiring patterns being electrically connected with the pair of electrode terminals of the plurality of battery cells, each of the plurality of battery cells includes, as the pair of electrode terminals thereof, a positive terminal and a negative terminal that are formed on a formation surface of the battery cell and aligned with each other in a second direction perpendicular to the first direction;

a monitoring circuit electrically connected with the pair of electrode terminals of the plurality of battery cells via the plurality of wiring patterns, the monitoring circuit being configured to monitor voltages of the plurality of battery cells inputted to the monitoring circuit via the plurality of wiring patterns;

a plurality of noise removal elements provided in the plurality of wiring patterns to remove noise inputted to the plurality of wiring patterns, the plurality of noise removable elements being provided in monitoring circuit-side parts of the plurality of wiring patterns; and a monitoring unit including a wiring board, the monitoring circuit being provided on the wiring board, wherein:

all the pair of electrode terminals of the plurality of battery cells are classified into a first electrode-terminal group and a second electrode-terminal group that are aligned with and spaced from each other in the second direction, in each of the first and second electrode-terminal groups, the positive terminals of the plurality of battery cells are arranged alternately with the negative terminals of the plurality of battery cells in the first direction, an arrangement order of the positive and negative terminals in the first electrode-terminal group is opposite to an arrangement order of the positive and negative terminals in the second electrode-terminal group, the flexible substrate is provided between the first and second electrode-terminal groups to face the formation surfaces of the plurality of battery cells, the flexible substrate is comprised of a first flexible substrate located adjacent to the first electrode-terminal group and a second flexible substrate located adjacent to the second electrode-terminal group, and the wiring board is opposed to both the first and second flexible substrates in a third direction perpendicular to both the first and second directions and connected with both the first and second flexible substrates.

13. The monitoring apparatus as set forth in claim 12, wherein:

the wiring board has a plurality of board wirings formed on the wiring board, the plurality of board wirings are formed of a plurality of first board wirings each of which electrically connects a corresponding one of the plurality of wiring patterns formed on the first flexible substrate to the monitoring circuit and a plurality of second board wirings each of which electrically connects a corresponding one of the plurality of wiring patterns formed on the second flexible substrate to the monitoring circuit, each of the plurality of first and second board wirings includes a third wiring electrically connected to the corresponding wiring pattern and a fourth wiring electrically connected to the monitoring circuit, the wiring board has first and second surfaces that are opposite to each other in the third direction, in each of the plurality of first board wirings, part of the third wiring is formed on one of the first and second surfaces of the wiring board to extend from a first flexible substrate side to a second flexible substrate side, in each of the plurality of second board wirings, part of the third wiring is formed on the other of the first and second surfaces of the wiring board to extend from the second flexible substrate side to the first flexible substrate side, the plurality of fourth wirings of the plurality of first and second board wirings are arranged from one of the first flexible substrate side and the second flexible substrate side to the other of the first flexible substrate side and the second flexible substrate side in the second direction in increasing order of electric potentials of the pair of electrode terminals respectively connected to the plurality of first and second board wirings via the plurality of first and second wiring patterns, and the plurality of fourth wirings of the plurality of first board wirings are arranged alternately with the plurality of fourth wirings of the plurality of second board wirings in the second direction.

14. The monitoring apparatus as set forth in claim 12, wherein:

the monitoring unit further includes a plurality of switches each of which is provided to control charge and discharge of a corresponding one of the plurality of battery cells, the wiring board has a plurality of board wirings formed on the wiring board, the plurality of board wirings are respectively connected to the pair of electrode terminals of the plurality of battery cells via the plurality of wiring patterns and arranged in order of electric potentials of the pair of electrode terminals respectively connected thereto, and each of the plurality of switches is provided between one adjacent pair of the plurality of board wirings with one end of the switch electrically connected to one of the plurality of board wirings of the adjacent pair and the other end of the switch electrically connected to the other of the plurality of board wirings of the adjacent pair.

15. The monitoring apparatus as set forth in claim 14, wherein:

the monitoring unit further includes a plurality of filters to remove noise inputted to the plurality of board wirings, the plurality of board wirings respectively connect the plurality of wiring patterns to the monitoring circuit, and the plurality of filters are provided in monitoring circuit-side parts of the plurality of board wirings.

16. The monitoring apparatus as set forth in claim 15, wherein intervals between parts of the plurality of board wirings which are respectively located between the plurality of filters and the monitoring circuit are greater than intervals between parts of the plurality of board wirings which are respectively located between the plurality of filters and the plurality of wiring patterns.

17. The monitoring apparatus as set forth in claim 15, wherein each of the plurality of filters includes a capacitor that is electrically connected between one adjacent pair of the plurality of board wirings.

* * * * *